(12) United States Patent
Sakamoto et al.

(10) Patent No.: US 8,537,619 B2
(45) Date of Patent: Sep. 17, 2013

(54) NONVOLATILE SEMICONDUCTOR STORAGE DEVICE AND METHOD OF CONTROLLING AND MANUFACTURING THE SAME

(75) Inventors: Wataru Sakamoto, Mie (JP); Fumitaka Arai, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/237,320

(22) Filed: Sep. 20, 2011

(65) Prior Publication Data
US 2012/0069669 A1 Mar. 22, 2012

(30) Foreign Application Priority Data

Sep. 22, 2010 (JP) ................. 2010-212221

(51) Int. Cl.
*G11C 11/34* (2006.01)
(52) U.S. Cl.
USPC ............................... 365/185.18; 365/185.24
(58) Field of Classification Search
USPC ...................... 365/185.18, 185.24
See application file for complete search history.

(56) References Cited

U.S. PATENT DOCUMENTS

| 7,505,312 | B2 | 3/2009 | Matsunaga et al. |
| 7,859,898 | B2 | 12/2010 | Arai et al. |
| 2003/0235078 | A1 | 12/2003 | Chen et al. |
| 2004/0012998 | A1 | 1/2004 | Chen et al. |
| 2004/0020861 | A1 | 10/2004 | Toda |
| 2006/0104114 | A1 | 5/2006 | Toda |
| 2006/0239093 | A1* | 10/2006 | Mukunoki ............. 365/210 |
| 2007/0159881 | A1 | 7/2007 | Arai et al. |
| 2009/0034336 | A1 | 2/2009 | Kwak et al. |
| 2009/0109743 | A1* | 4/2009 | Goda et al. ............. 365/185.03 |
| 2009/0190399 | A1 | 7/2009 | Shibata et al. |
| 2009/0251964 | A1 | 10/2009 | Sasago et al. |
| 2010/0208519 | A1 | 8/2010 | Shiga et al. |
| 2010/0332946 | A1 | 12/2010 | Lee et al. |
| 2011/0069542 | A1 | 3/2011 | Sato et al. |
| 2011/0128783 | A1* | 6/2011 | Baek et al. ............. 365/185.2 |
| 2012/0069678 | A1 | 3/2012 | Arai et al. |
| 2012/0170378 | A1* | 7/2012 | Aritome et al. ........ 365/185.24 |

FOREIGN PATENT DOCUMENTS

| JP | 2004-319007 | 11/2004 |
| JP | 2005-243709 | 9/2005 |
| JP | 2005-530362 | 10/2005 |
| JP | 2009-38382 | 2/2009 |
| JP | 2009-123256 | 6/2009 |
| JP | 2009-252293 | 10/2009 |
| JP | 2009-272016 | 11/2009 |
| JP | 2010-192049 | 9/2010 |
| WO | WO 2004/001852 A1 | 12/2003 |

* cited by examiner

*Primary Examiner* — Michael Tran
(74) *Attorney, Agent, or Firm* — Oblon, Spivak, McClelland, Maier & Neustadt, L.L.P.

(57) ABSTRACT

A nonvolatile semiconductor storage device is disclosed. The device includes a cell group having a first memory cell and a second memory cell located first directionally adjacent to the first memory cell, and a programming circuit. The first memory cell is used for data retention and the second memory cell is used for adjustment of a threshold voltage of the first memory cell. The programming circuit is configured to program the first memory cell by applying voltage to the second memory cell to control the threshold voltage of the first memory cell to be higher than a first threshold voltage.

16 Claims, 35 Drawing Sheets

NONVOLATILE SEMICONDUCTOR STORAGE DEVICE AND METHOD OF CONTROLLING AND MANUFACTURING THE SAME

CROSS-REFERENCE TO RELATED APPLICATION(S)

This application is based upon and claims the benefit of priority from Japanese Patent Application No. 2010-212221, filed on, Sep. 22, 2010 the entire contents of which are incorporated herein by reference.

FIELD

Embodiments disclosed herein generally relate to a nonvolatile semiconductor storage device provided with programmable memory cells and a method of controlling and manufacturing such nonvolatile semiconductor storage device.

BACKGROUND

Nonvolatile semiconductor storage device such as a NAND flash memory device has found application in a wide range of products such as digital cameras, mobile terminals, portable audio, and SSD (Solid State Drives) which is an emerging storage solution to replace hard disk drives conventionally used in large volume storage applications for mobile computers.

Flash memory device is typically known to employ a stacked gate structure of floating gate type in which a control gate electrode is stacked above a floating gate electrode.

With advances in microfabrication and densification, semiconductor devices are being fabricated based on design rules that go beyond the resolution limits of today's lithography process. Driven by such tight design rules, the so-called cross coupling effect is increasing its influence on device properties which can be typically observed through variation in threshold voltage when programming a memory cell located adjacent to another memory cell.

The variation in threshold voltage, that is, expanded distribution of program threshold voltage is typically induced by: too much or too less impurity dope, dimension and shape variance, and program noise within the memory cell elements. The expanded distribution of program threshold leads to greater negative impact on the speed and reliability of operation.

DESCRIPTION

Figure 1:
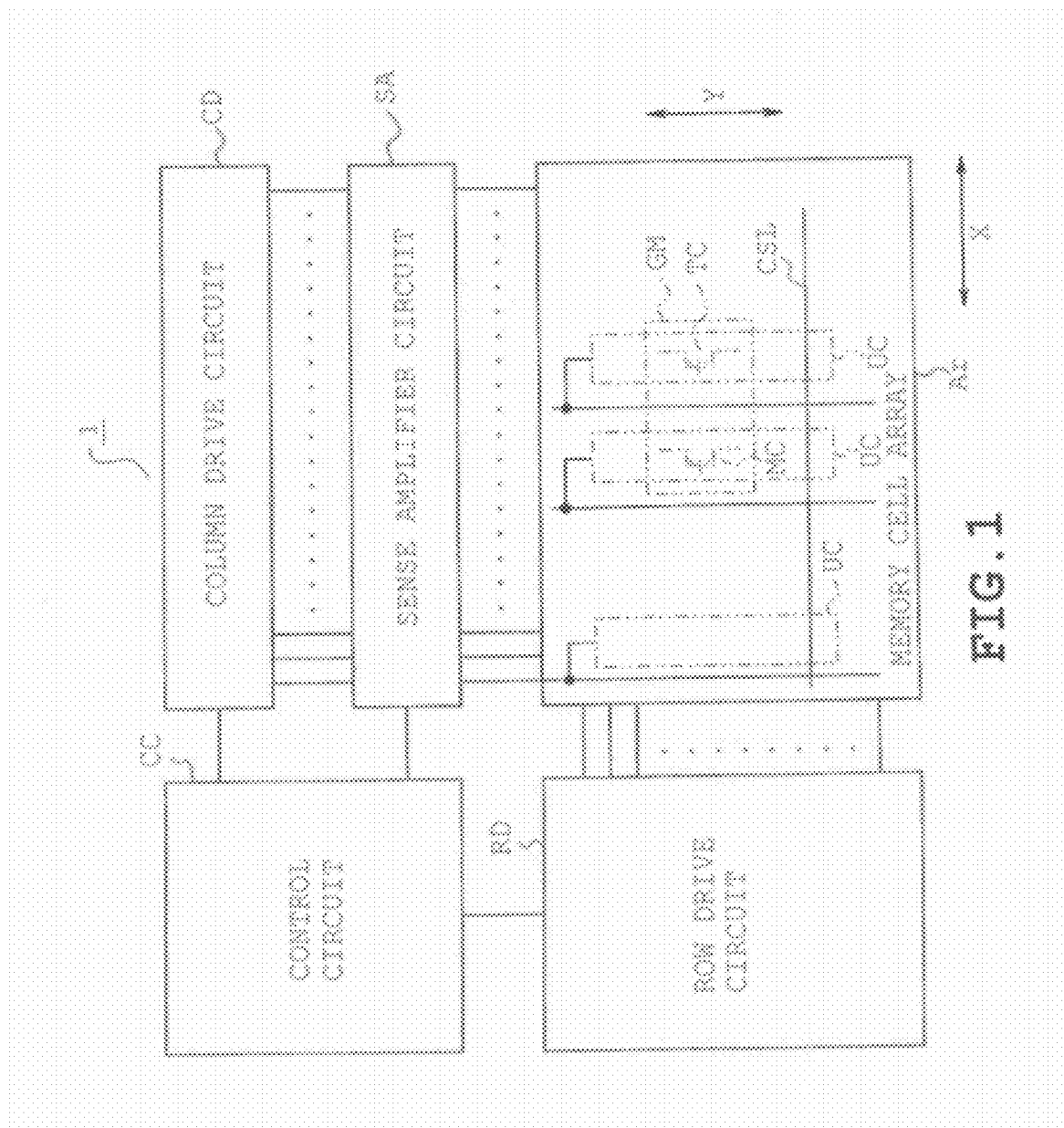
FIG. 1 is a block diagram indicating the electrical configuration according to a first embodiment.

In one embodiment, a nonvolatile semiconductor storage device is disclosed. The device includes a cell group having a first memory cell and a second memory cell located first directionally adjacent to the first memory cell, and a programming circuit. The first memory cell is used for data retention and the second memory cell is used for adjustment of a threshold voltage of the first memory cell. The programming circuit is configured to program the first memory cell by applying voltage to the second memory cell to control the threshold voltage of the first memory cell to be higher than a first threshold voltage.

In one embodiment, a method of controlling a nonvolatile semiconductor storage device provided with a cell group including a first memory cell and a second memory cell first directionally adjacent to the first memory cell is disclosed. The method includes programming the first memory cell by: applying a first voltage to the first memory cell, applying a second voltage to the second memory cell, and determining whether or not a threshold voltage of the first memory cell is greater than a target threshold voltage. If the threshold voltage of the first memory cell is determined not to be greater than the target threshold voltage, the application of the second voltage to the second memory cell is repeated while gradually increasing the second voltage until the target threshold voltage is obtained.

In one embodiment, a method of manufacturing a nonvolatile semiconductor storage device provided with a cell group including a first memory cell for data retention and a second memory cell for adjusting a threshold voltage of the first memory cell is disclosed. The method includes preparing a semiconductor substrate; forming a gate insulating film above the semiconductor substrate; forming a floating gate electrode film above the gate insulating film; and forming a plurality of mask patterns each used for forming the cell group and each including patterns that are spaced by a first width, the plurality of mask patterns each being spaced by a second width greater than the first width. The method further includes etching the floating gate electrode film, the gate insulating film, and the semiconductor substrate to form a plurality of element isolation trenches using the mask pattern as a mask, thereby obtaining a first floating gate electrode of the first memory cell and a second floating gate electrode of the second memory cell located adjacent to each other by the first width. The method still further includes filling each of the element isolation trenches with an element isolation insulating film; forming an intergate insulating film above the first floating gate electrode and the second floating gate electrode; and forming a word line above the intergate insulating film.

Embodiments are described hereinafter with references to the accompanying drawings to provide illustrations of the features of the embodiments. Elements that are identical or similar are represented by identical or similar reference symbols across the figures and are not redescribed. The drawings are not drawn to scale and thus, do not reflect the actual measurements of the features such as the correlation of thickness to planar dimensions and the relative thickness of different layers. Directional and dimensional notations such as up/down/left/right/high/low/deep/shallow are noted relative to the underside of a later described semiconductor substrate.

With reference to FIGS. 1 to 22, a description will be given hereinafter on a first embodiment of a nonvolatile semiconductor storage device through a NAND flash memory device application.

FIG. 1 is a schematic block diagram indicating the electrical configuration of a NAND flash memory device. Though applicable to MLC (Multi Level Cell) as well, the first embodiment will be described based on SLC (Single Level Cell) NAND flash memory device for simplicity.

As schematically shown in FIG. 1, flash memory device 1 is provided with memory cell array Ar which is an array of matrix aligned cell groups GM including memory cell MC also referred to as a first memory cell and dummy cell TC also referred to as second memory cell. Data stored in memory cell MC may be erased/programmed (written)/read. Though structurally similar to memory cell MC, dummy cell TC is configured to control the threshold voltage of memory cell MC and is not used for data retention. Multiplicity of bit lines BL, word lines WL, and common source lines CSL run across memory cell array Ar. Memory cell array Ar also contains an allocation flag buffer and program count buffer later described in detail.

As exemplified in FIG. 1, memory cell array Ar is surrounded by circuitry typically referred to as peripheral circuitry such as sense amplifier circuit SA, control circuit CC, row drive circuit RD, and column drive circuit CD.

Sense amplifier SA includes a programming buffer circuit and a read sense amplifier, and is used for programming and reading memory cells MC within memory cell array Ar. Row drive circuit RD includes a row decoder for selecting word line WL and a select gate line. Column drive circuit CD includes a column decoder for selecting bit line BL running across memory cell array Ar.

Control circuit CC transmits control signals to row drive circuit RD and column drive circuit CD in response to incoming control signals to function as a programming, read, and erase circuits for programming, reading, and erasing memory cells MC within each cell group GM of memory cell array Ar.

Control circuit CC determines the allocation of tasks to be undertaken by memory cell MC and dummy cell TC and stores the flag indicative of such tasks in the allocation flag buffer. The allocation flag buffer, being located in memory cell array Ar, is a nonvolatile storage area. Control circuit CC also counts the program/erase cycle with programming counter and updates the programming count buffer. The programming count buffer is a storage area located in memory cell array Ar for storing the count of program/erase cycles.

Figure 2:
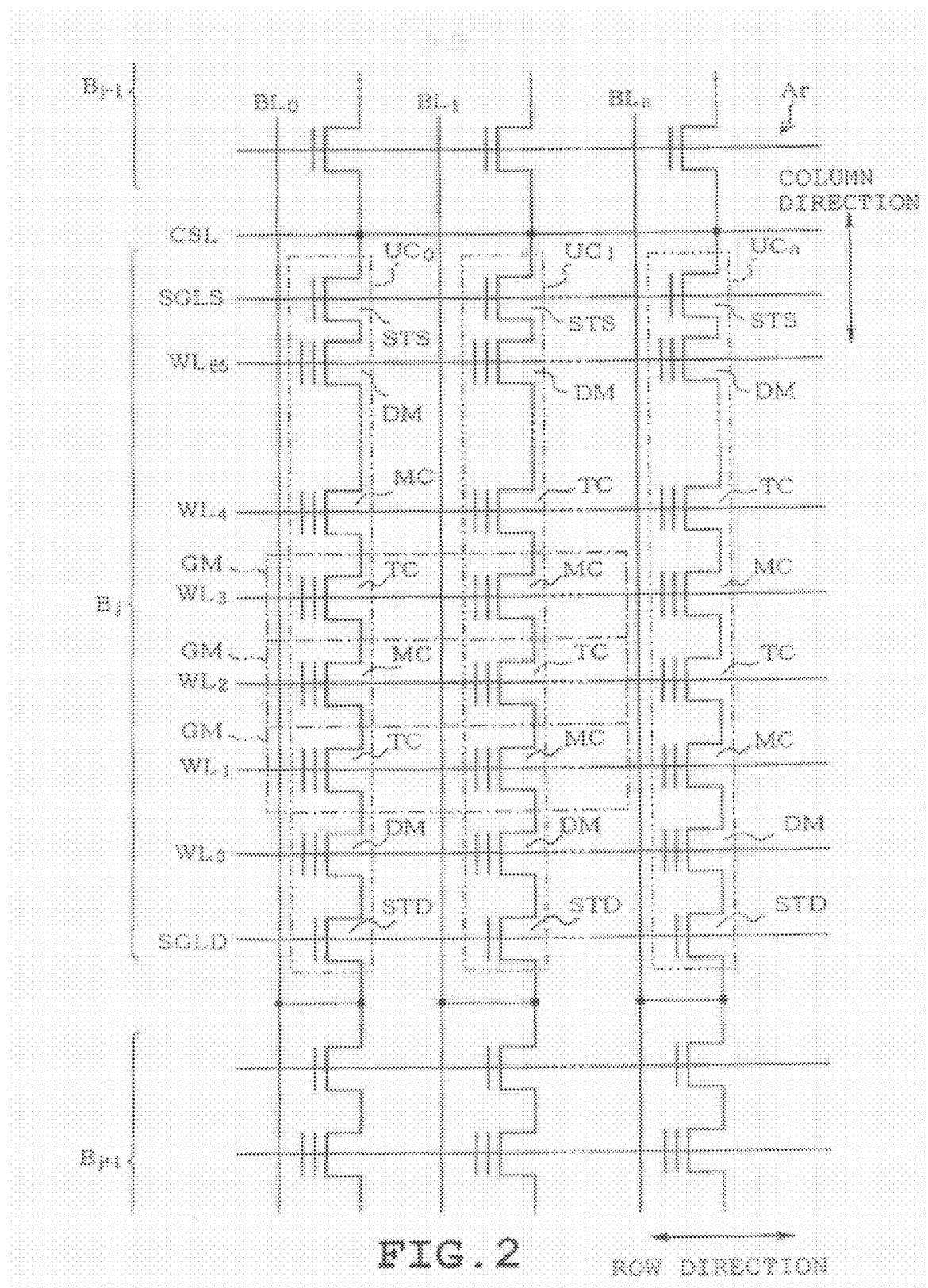
FIG. 2 is a partial circuit diagram of a memory cell array according to the first embodiment.

FIG. 2 is a partial and schematic indication of the electrical configuration of the memory cell array Ar located within the memory cell region.

As partially shown, memory cell array Ar is configured by multiplicity of blocks generally numbered as block $B_{j-1}$, block $B_j$, block $B_{j+1}$ and so forth.

Blocks are aligned in the column direction (Y direction) and each block is configured by multiplicity of strings of NAND cells referred to as NAND cell units UC, numbered from $UC_0$ to $UC_n$, aligned in the row direction (X direction).

NAND cell unit UC, or simply cell unit UC, typically includes a drain-side select gate transistor STD and a source-side select gate transistor STS. Select gate transistor STD has bit line BL connected to either of its drain and source and dummy cell DM connected in series to the remaining other of its drain and source. Select gate transistor STS has source line CSL connected to either of its drain and source and dummy cell DM connected in series to the remaining other of its drain and source. Between dummy cell DM connected to the drain-side select transistor STD and dummy cell DM connected to source-side select transistor STS, even number of memory cells, numbered from 1 to 64 for instance, are provided such that memory cell MC and dummy memory cell TC are alternately series connected in the column direction so as to share their source and drain regions.

The even number cell units UC such as the $0^{th}$, $2^{nd}$ and $4^{th}$ cell units $UC_0$, $UC_2$, and $UC_4$ are arranged such that the alternate series connection of cells begins with dummy cell TC. In contrast, the odd number cell units UC such as $1^{st}$, $3^{rd}$, and $5^{th}$ cell units $UC_1$, $UC_3$, and $UC_5$ are arranged such that the alternate series connection of cells begins with memory cell MC.

Dummy cell DM is a sacrificial cell to allow programming of charge originating from GIDL (Gate Induced Drain Leakage) occurring in the proximity of select gate transistors STD and STS during program. Dummy cell DM is structurally similar to memory cell MC and dummy cell TC but the data stored in dummy cell DM is invalidated.

Still referring to FIG. 2, multiplicity of bit lines BL extend in the column direction (Y direction) and each bit line BL is associated with cell units UC arranged in the column direction. Multiplicity of source lines CSL extend in the row direction (X direction) and each source line CSL extends between two adjacent blocks such as block $B_j$ and block $B_{j+1}$ and is shared by the two blocks. Though only one is shown, multiplicity of select gate lines SGLD and SGLS extend in the row direction. Select gate line SGLD interconnects gate electrodes SGD shown in FIG. 4 of select gate transistors STD provided in each of cell units UC being aligned in the row direction. Similarly, SGLS interconnects gate electrodes SGS shown in FIG. 4 of select gate transistors STS provided in cell units UC being aligned in the row direction. Between select gate lines SGLD and SGLS, multiplicity of word lines WL extend in the row direction to interconnect control gates CG shown in FIG. 4 of memory cells MC and dummy cells TC and DM of cell units UC being aligned in the row direction.

Among the multiplicity of word lines WL, word line $WL_0$ serves as a common word line for each of control gate electrodes CG provided in the drain-side dummy cell DM of cell units UC aligned in the row direction, whereas word line $WL_{65}$ serves as a common word line for each of control gate electrodes CG provided in the source-side dummy cell DM of cell units UC aligned in the row direction. Word line $WL_0$ and word line $WL_{65}$ functions as dummy or sacrificial word lines that relax the strong electric field generated at the ends of cell unit UC during the programming operation to prevent program errors.

Word lines WL1 to WL 64 located between word line $WL_0$ and word line $WL_{65}$ each interconnect memory cell MC and dummy cell TC which appear alternately along the same word line as can be understood by the alternate arrangement of cell units UC containing strings of memory cells MC and cell units containing strings of dummy cells TC in the word line direction.

Stated differently, as can be seen in FIG. 2, the odd numbered word lines WL such as word lines $WL_1$, $WL_3$, $WL_5$, . . . $WL_{63}$ electrically interconnect control gate electrodes CG shown in FIG. 4 of memory cells MC within the odd numbered cell units UC as well as electrically interconnecting control gate electrodes CG of dummy cells TC within the even numbered cell units UC.

Similarly, as can be seen in FIG. 2, the even numbered word lines WL such as word lines $WL_2$, $WL_4$, $WL_6$, . . . $WL_{64}$ electrically interconnect control gate electrodes CG shown in FIG. 4 of memory cells MC within the even numbered cell units UC as well as electrically interconnecting control gate electrodes CG of dummy cells TC within the odd numbered cell units UC.

The multiplicity of memory cells MC and dummy cells TC spanning over multiplicity of cell units UC being interconnected by the same word line constitutes a single page. For example, 4224 cells are contained in a given block and among the 4224 cells, 2048 cells are memory cells MC, 2098 cells are dummy cells TC and 128 cells are cells that may be used as a redundancy region or other regions as required.

Cell group GM is a group of memory cells MC and dummy cells TC that are interconnected by the same word line extending in the X direction. In the first embodiment, a single cell group GM contains pairs of memory cell MC and dummy cell TC aligned in the X direction.

Figure 4:
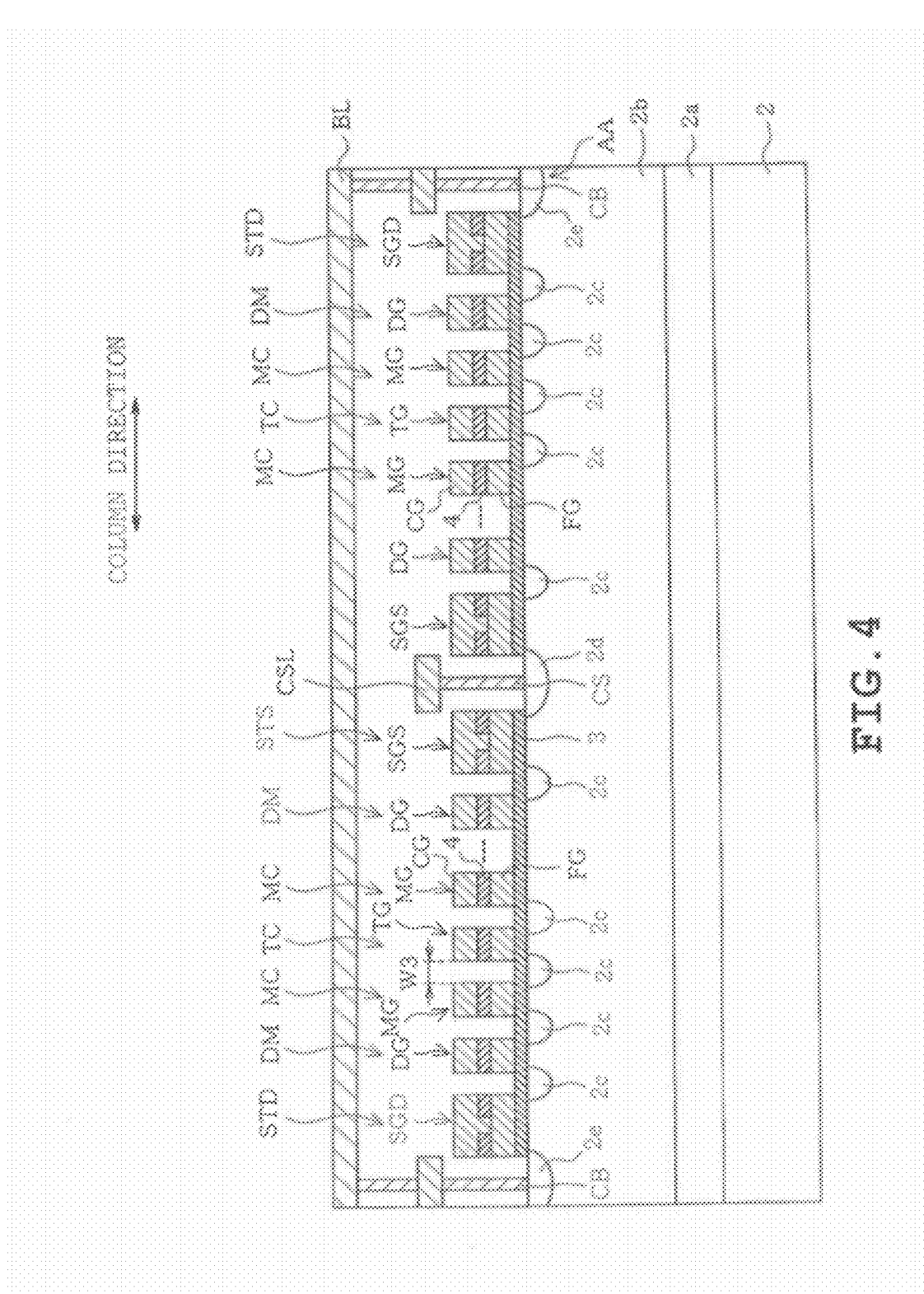
FIG. 4 is a schematic vertical cross sectional view of a NAND cell unit taken along a column direction of the memory cell array according to the first embodiment.

As can be seen in FIG. 2, select gate line SGLD interconnect gate electrodes SGD shown in FIG. 4 of select transistors STD within cell units UC being aligned in the word line direction. Similarly, select gate line SGLS interconnect gate electrodes SGS shown in FIG. 4 of select transistors STS within cell units UC being aligned in the word line direction.

Figure 3:
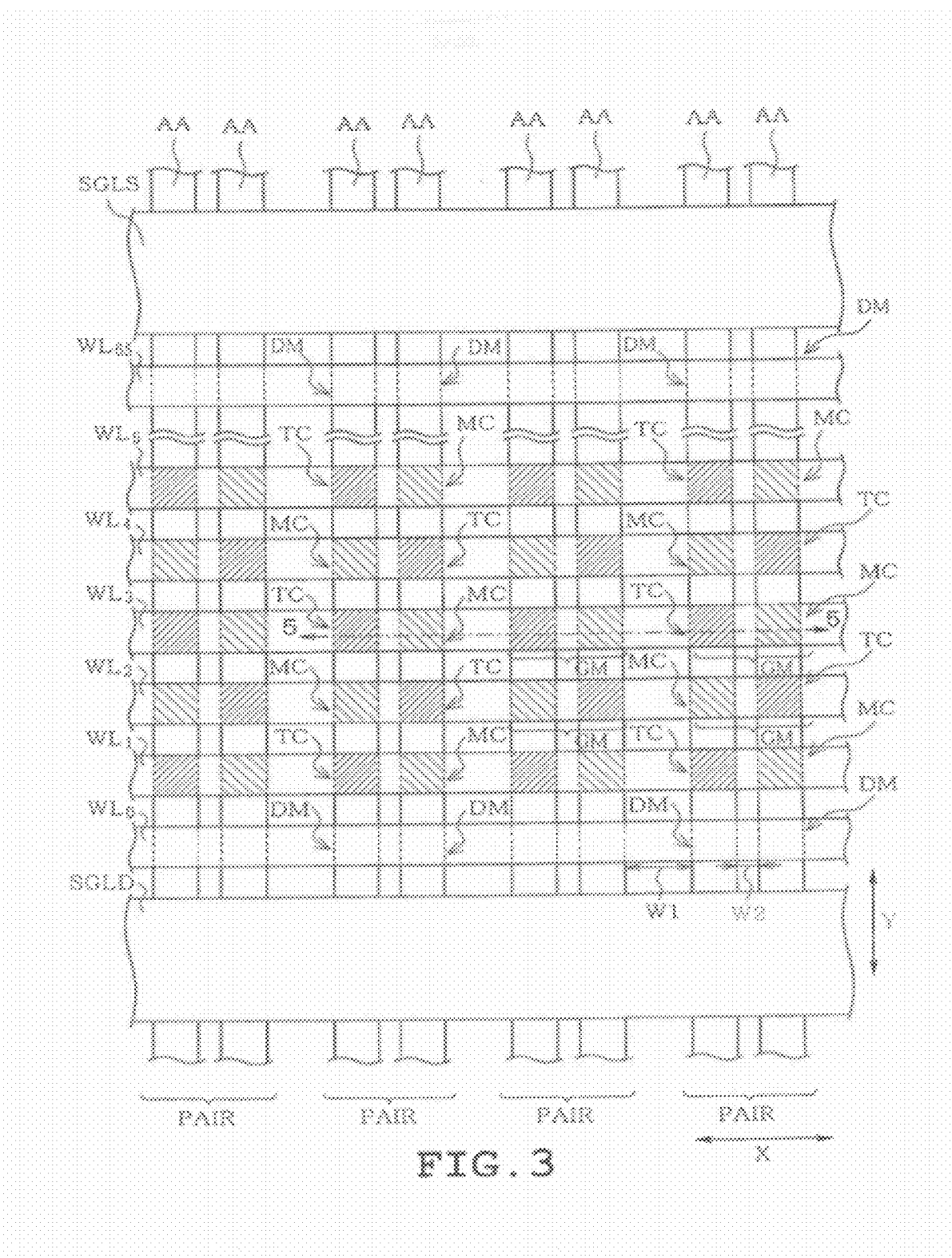
FIG. 3 is a schematic plan view partially illustrating the memory cell array according to the first embodiment.

FIG. 3 is a schematic plan view partially illustrating a memory cell array Ar. As can be seen in FIG. 3, multiplicity of active areas AA extend in the Y direction within the surface layer of semiconductor substrate 2 as shown in the cross sectional view of FIG. 4. The widths of the active areas AA are constant through out the memory cell array Ar. Two adjacent active areas AA make up a pair as shown in FIG. 2 and each pair of active areas AA is spaced apart from the neighboring pair by width W1. The active areas AA within each pair are spaced apart from each other by width W2 which is less than width W1.

Each of word lines WL extend in the X direction and intersect with active areas AA. Similarly, dummy word lines $WL_0$, $WL_{65}$ and select gate lines SGLD, SGLS extend in the X direction and intersect with active areas AA. Though not shown in FIG. 3, bit line BL is formed so as to run above active area AA in the direction normal to the page as can be seen in FIG. 4.

Memory cells MC as well as dummy cells TC are located at the intersections of active areas AA and word lines WL. A plurality of memory cells MC and dummy cells TC are formed alternately in each strip of active area AA running along the Y-direction. Stated differently, memory cells MC are disposed in a zigzag across the pair of active areas AA, and the dummy cells TC are also disposed in a zigzag across the pair of active areas AA so as to occupy the space left open by memory cells MC.

FIG. 4 schematically illustrates the cross section of cell unit UC taken along the Y direction. FIG. 4 only shows the structures pertinent to the features of the first embodiment, and thus, other irrelevant details of flash memory 1 are not shown.

As can be seen in FIG. 4, n well 2a and p well 2b are formed in the listed sequence in the surface layer of semiconductor substrate 2, a typical example of which is a silicon substrate. Above p well 2b, select gate electrode SGD of select gate transistor STD is formed at one end of cell unit UC by way of gate insulating film 3 whereas on the other end of cell unit UC, select gate electrode SGS of select gate transistor STS is formed above p well 2b by way of gate insulating film 3. Beside select gate electrode SGD and select gate electrode SGS, dummy gate electrodes DG of dummy cell DM are formed over semiconductor substrate 2 by way of gate insulating film 3. Between dummy gate electrodes DG, gate electrodes MG of memory cell MC and dummy gate electrode TG of dummy cell TC are disposed alternately.

Gate electrode MG is configured by a stack of floating gate electrode FG and control gate electrode CG with intergate insulating film 4 interposed therebetween. Dummy gate electrode DG is similar in structure to gate electrode MG. Select gate electrodes SGD and SGS are also basically similar to gate electrode MG but has a central through hole penetrating gate insulating film 4 to electrically interconnect gate electrode FG and CG.

The adjacent gate electrodes within cell unit UC share source/drain region 2c formed therebetween. Source/drain region 2c is formed in the surface layer of semiconductor substrate 2 typically by ion implantation. However, the ion implantation can be omitted when each of memory cells MC and dummy cells TC are interconnected in series.

In the surface layer of semiconductor substrate 2 situated between select gate electrodes SGS of the adjacent cell units UC, source line contact region 2d is formed for establishing contact with source line CSL through source line contact CS. In semiconductor substrate 2 situated on one side of select gate electrode SGD, bit line contact region 2e is formed for establishing contact with bit line BL through bit line contact CB. The cross section shown in FIG. 4 shows active area AA of cell unit UC being formed in the surface layer of p well 2b so as to extend from bit line contact region 2e to source line contact region 2d.

Figure 5:
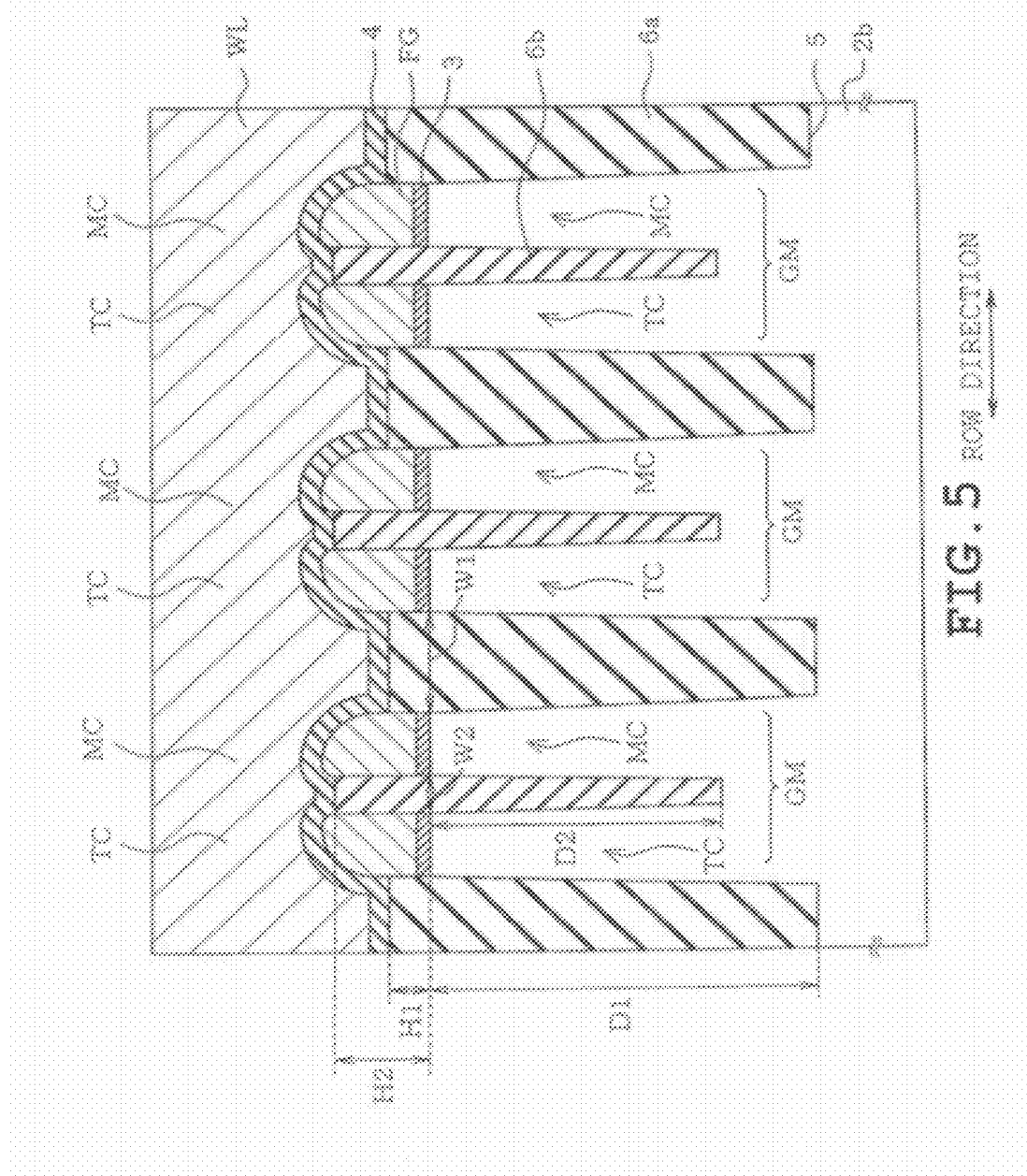
FIG. 5 is a schematic vertical cross sectional view of the memory cell array taken along a row direction according to the first embodiment.

FIG. 5 schematically illustrates the cross section taken along line 5-5 of FIG. 3 which is oriented in the X direction. FIG. 5 only shows the structures pertinent to the features of the first embodiment, and thus, other irrelevant details of flash memory 1 are not shown.

As shown in FIG. 5, multiplicity of element isolation trenches 5 spaced from one another in the X direction are formed in the surface layer of semiconductor substrate 2.

The depth of X directionally aligned element isolation trenches 5 from the surface of semiconductor substrate 2 alternates between first depth D1 and second depth D2 which is less than depth D1. Trenches 5 having first depth D1 has first width W1 taken in the X direction, whereas trenches 5 having second depth D2 has second width W2 less than width W1 taken in the X direction.

Trenches 5 are filled with element isolation insulating film 6 typically comprising a silicon oxide film to form an element isolation region employing an STI scheme. Element isolation insulating film 6 filled in element isolation trench 5 having first depth D1 will be hereinafter referred to as element isolation insulating film 6a, whereas element isolation insulating film 6 filled in the element isolation trench having second depth D2 will be referred to as element isolation insulating film 6b.

Upper surface of both element isolation insulating films 6a and 6b protrudes above the upper surface of semiconductor substrate 2. Height H2 of the upper surface of element isolation insulating film 6b is higher than height H1 of element isolation insulating film 6a. Above semiconductor substrate 2 situated between element isolation insulating films 6a and 6b, gate insulating film 3 is formed so as to be interposed in contact with a portion of the sidewalls of element isolation insulating film 6a and 6b.

Above the upper surface of gate insulating film 3, floating gate electrode FG is formed which is made, for instance, of polycrystalline silicon doped with impurities. The upper surface of floating gate electrode FG is higher than height H1 of the upper surface of element isolation insulating film 6a and height H2 of the upper surface of element isolation insulating film 6b. In a modified embodiment, the upper surface of floating gate electrode FG may be level with the upper surfaces of element isolation insulating films 6a and 6b.

As can be seen from FIG. 3, second width W2 constitutes the X-directional width between X-directionally adjacent memory cell MC and memory cell TC within a given memory cell group GM.

Intergate insulating film 4 is formed above floating gate electrode FG and element isolation insulating films 6a and 6b. Intergate insulating film 4 typically takes a stacked structure such as ONO (Oxide-Nitride-Oxide) or NONON (Nitride-Oxide-Nitride-Oxide-Nitride) structure.

Above intergate insulating film 4, word line WL is formed which comprises a polycrystalline silicon layer and silicide layer. The silicide layer is obtained by siliciding the upper portion of polycrystalline silicon with metal. Word line WL may also comprise a stack of metal and polycrystalline silicon. Word line WL is an interconnection of control gate electrodes CG of memory cells MC and dummy cells TC spanning over multiple cell units UC.

As described above, each memory cell MC as well as dummy cell TC associated with it has floating gate electrode FG. The charge stored in floating gate electrode FG of memory cell MC and floating gate electrode FG of dummy cell TC determine the threshold voltage of memory cell MC which is stored as binary data i.e. "1" or "0". Data is programmed/read sequentially page by page and erased at once in blocks.

Next, the working of the binary storage scheme of NAND flash memory device 1 will be described primary through programming operation. In a binary NAND flash memory device 1, a single memory cell MC stores binary data i.e. "1" or "0" through adjustment of threshold voltage Vt into either of two voltage distribution ranges. The threshold voltage Vt of memory cell MC is specified based on the amount charge stored in the floating gate electrodes FG of memory cell MC and the adjacent dummy cell TC associated with a given memory cell MC.

Figure 6:
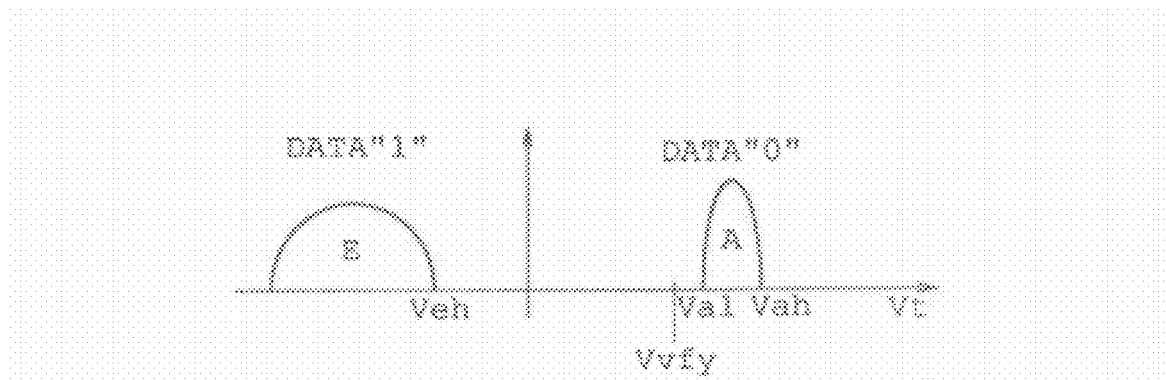
FIG. 6 is a chart indicating distributions of threshold voltage according to the first embodiment.

FIG. 6 indicates the threshold voltage distribution of the memory cell. Distribution E and distribution A are threshold voltage distributions that translate into binary data of "1" and "0". Distribution E having a relatively wide distribution range has upper limit voltage Veh and represents the threshold voltage distribution taken after block erase. Threshold voltage Vt of memory cell MC, when ranging within distribution E, translates to data "1". Distribution A having a relatively narrow distribution range has lower limit voltage Val and upper limit voltage Vah and represents the threshold voltage distribution taken after programming. Threshold voltage Vt of memory cell MC, when ranging within distribution A, translates to data "0".

Upper limit voltage Veh of the E distribution is configured so as to be lower than the lower limit voltage Val, meaning that distribution E and distribution A are specified such that distribution A has greater voltage values as compared to distribution E. In order to verify that memory cell MC has been properly programmed, verify voltage Vvfy is specified at a slightly smaller voltage value as compared to lower limit voltage Val of distribution A.

Next, a brief description is given on the basic operation of voltage application during erase, program, and read in flash memory 1.

Erasing is done in blocks, meaning that memory cells within the same block are erased at once. When erasing, control circuit CC applies ground potential (0V) to control gate electrode CG as well as high voltage to p well 2b. Responsively, tunnel current flows from floating gate electrode FG of the selected blocks to p well 2b of semiconductor substrate 2 to release the electrons from floating gate electrode FG. As a result, threshold voltage Vt of memory cells MC and dummy cells TC within selected block shifts from positive to negative. Because electric properties such as erase speed varies between each memory cell MC and dummy cell TC, distribution E spans over relatively wide first distribution range.

Programming is done in pages as mentioned earlier. When programming, control circuit CC applies low voltages to bit line BL and source line CSL of the selected cell unit UC and high voltage on the selected word line WL. Examples of voltages applied during programming may be 0V for bit line BL and 1.5V for source line CSL of the selected cell unit UC, and 20V for the selected word line WL. Responsively, active area AA of the selected memory cell MC is subjected to low voltage whereas the selected word line WL is subjected to high voltage, thereby producing tunneling current through gate insulating film 3 to cause electrons to be injected into floating gate electrode FG of the selected memory cells MC. As a result, control circuit CC shifts threshold voltage Vt of memory cells MC from distribution E ranging between negative voltage values representing the erased state to distribution A ranging between positive voltage values representing the programmed state.

As for non-selected cell units UC, because control circuit CC specifies voltage Vd of bit line BL to positive power supply voltage Vdd, active area AA of p well 2b within semiconductor substrate 2 serving as the channel region is capacitively coupled with control gate CG to be stepped up to an intermediate voltage level which is greater than the low voltage but less than the positive voltage. Thus, even if high voltage is applied to the selected word line WL, charge injection into floating gate electrode FG of memory cells MC of non-selected cell units UC is restrained to inhibit programming of such memory cells MC.

Reading is done by control circuit CC by applying 0V to selected word line WL of selected cell unit UC and applying high voltage Vread which is designed to be greater than 0V and greater than the threshold voltage for programming any other cell. Responsively, cells exclusive of the selected memory cells act as transfer gate transistors, and control circuit CC reads the data corresponding to threshold voltage Vt of the selected memory cell MC through detection of voltage drops occurring in response to the ON/OFF status of such memory cells MC.

Next, a description will be given on erasing and programming which constitute the features of the first embodiment.

According to the first embodiment, dummy cell TC is used to make adjustments in threshold voltage Vt of memory cell MC. Thus, unlike memory cell MC which retains data through programming, dummy cell TC is not used for data retention.

Figure 7:
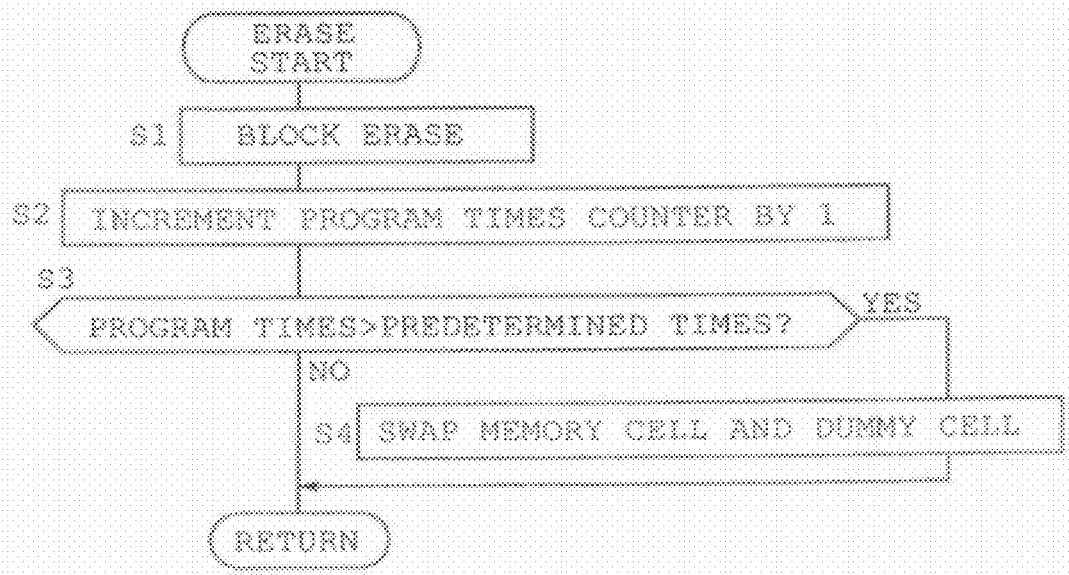
FIG. 7 is a flowchart indicating the process flow of an erase process according to the first embodiment.

FIG. 7 is a flowchart schematically indicating the process flow of erasing primarily carried out by control circuit CC. As indicated in FIG. 7, control circuit CC erases the selected block at step S1. After erasing, memory cell MC and dummy cell TC within the selected block are controlled to substantially the same level of threshold voltage Vt because erasing is carried out one block at a time under the same voltage application condition.

Then, at step S2, control circuit CC increments the program/reprogram counter by one every time a block is erased and retains the incremented count in the program/reprogram count buffer. Step S2 is followed by step S3 in which control circuit CC determines whether or not the program count has exceeded a preset limit, and if not (S3: No), proceeds with erasing but if so (S3: YES), proceeds to step S4 and swaps memory cell MC with dummy cell TC.

The swapping at step S4 is carried out through rewriting of the data stored in allocation flag buffer. Thus, memory cell MC responsible for data retention is swapped with dummy cell TC responsible for threshold voltage adjustment.

Swapping is carried out to even out the stress between memory cell MC and dummy cell TC. Both memory cell MC and dummy cell TC are subjected to high voltage during programming/erasing and thus, their gate insulating film 3 and interelectrode film 4 are affected by large level of stress. However, the tasks undertaken by memory cell MC and dummy cell TC require different voltage application levels during programming as will be later described in detail, and thus, are subjected to different levels of stress which is cumulative overtime. Swapping advantageously alleviates this unevenness of voltage application levels within memory cell array Ar, which in turn even outs the stress suffered by the cells within the memory cell array Ar to increase the reprogrammable times and endurance of NAND flash memory device 1.

Figure 8:
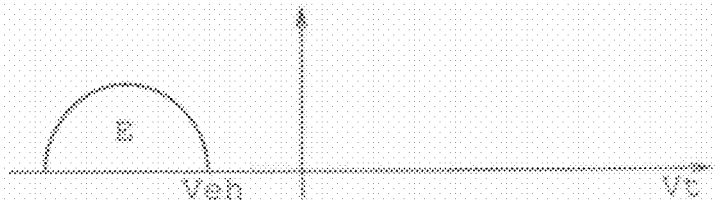
FIG. 8 is a chart indicating the distribution of the threshold voltage in the erased state according to the first embodiment.

FIG. 8 shows the threshold voltage distribution after erasing of memory cell MC and dummy cell TC. Threshold voltage Vt of every memory cell MC and dummy cell TC within the selected block is controlled within distribution E having upper limit voltage Veh.

Figure 9:
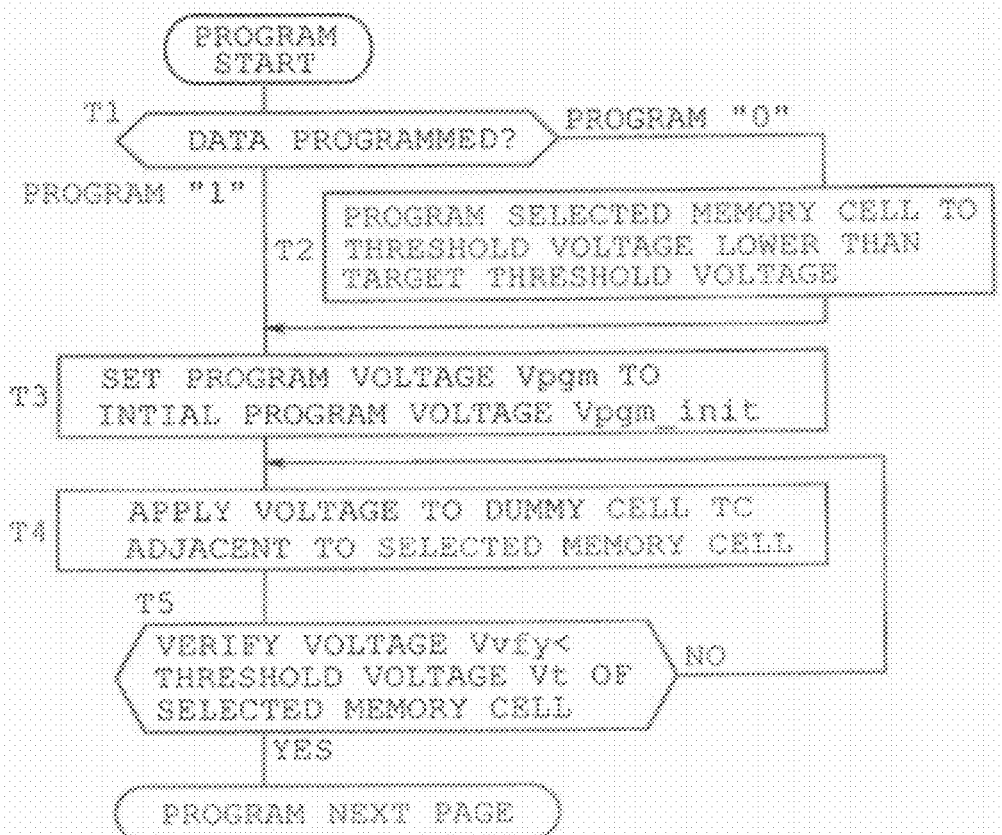
FIG. 9 is a flowchart indicating the process flow of a program process according to the first embodiment.

FIG. 9 is a flowchart indicating the process flow for programming memory cell MC of the selected cell unit UC with data "0" according to the first embodiment. In operation, word lines $WL_1$ to $WL_{64}$ are programmed sequentially page by page. FIG. 9 shows the process flow of control circuit CC when programming a given page.

As can be seen in FIG. 9, the process flow begins with step T1 in which control circuit CC determines whether not to program memory cell MC with data "0" based on data given externally and if so (T1: YES), the selected cell unit UC is subjected to the voltage application condition for selected cell unit UC as indicated in the program operation described earlier. Dummy cells TC adjacent to the selected memory cells MC within the same cell group GM are subjected to the voltage application condition for non-selected cell unit UC as indicated in the program operation described earlier to inhibit programming. In case it is determined that control circuit CC is not programming data "0", cell unit UC is subjected to the voltage application condition for non-selected cell unit UC as indicated in the program operation described earlier so as not to program memory cells MC.

Having specified the voltage application conditions for a page of cell units UC, the process proceeds to step T2 in which control circuit CC applies high voltage, also referred to as first voltage, to the selected word line WL of the selected memory cell MC within the selected cell unit UC to program the selected memory cell MC to threshold voltage Vt lower than a target threshold voltage, which may be the verify voltage or lower limit voltage Val as the case may be.

Figure 10A:
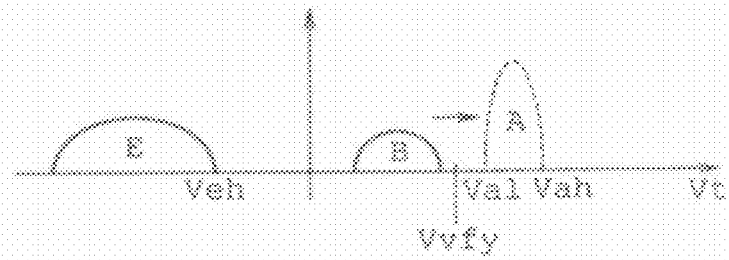
FIG. 10A is a chart indicating the transition in the distribution of the threshold voltage in a memory cell according to the first embodiment.
Figure 10B:
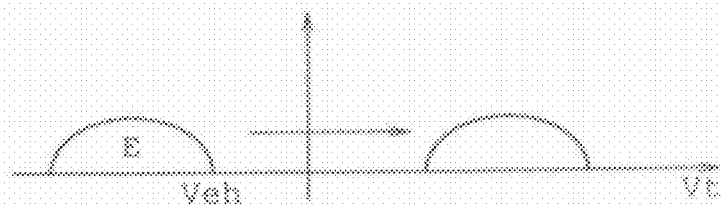
FIG. 10B is a chart indicating the transition in the distribution of the threshold voltage in a dummy cell according to the first embodiment.

FIGS. 10A and 10B illustrate the threshold voltage distribution resulting from step T2. FIG. 10A shows the transition of the threshold voltage distribution in memory cell MC, whereas FIG. 10B shows the transition of the threshold voltage distribution in dummy cell TC. As indicated in FIG. 10A, threshold voltage Vt of the selected memory cell MC is tentatively programmed to distribution B lower than verify voltage Vvfy. The maximum voltage level of distribution B is slightly lower, for instance by 1V, than verify voltage Vvfy and is located closer to distribution A than distribution E.

The preliminary programming of the selected memory cell MC to threshold voltage Vt within distribution B is intended to minimize the amount of charge injected into floating gate electrode FG of dummy cell TC when applying voltage to dummy cell TC in the subsequent step.

At this point in time, because dummy cell TC adjacent to the selected memory cell MC within the same cell group GM is placed in the unprogrammable state, threshold Vt of dummy cell TC is specified within distribution E which is substantially identical to the erased state of memory cell MC as shown in the threshold voltage distribution of dummy cell TC in the left side of FIG. 10B.

Next, control circuit CC places the selected memory cell MC in the unprogrammable state by specifying voltage Vd of bit line BL, which is in contact with the selected cell unit UC to which the selected memory cell MC belongs, to positive power supply voltage Vdd. Then, low voltage of 0V is applied to bit line BL which is in contact with cell unit UC adjacent to the selected cell unit UC within the same cell group GM to place the dummy cell TC used for threshold voltage adjustment into a state allowing voltage application. Under this state, control circuit CC programs dummy cell TC adjacent to memory cell MC within the same cell group MG by stepped programming scheme.

When control circuit CC applies stepped voltage, voltage Vpgm, also referred to as second voltage, is specified to initial voltage Vpgm_init at step T3 as indicated in FIG. 9, and at step T4, voltage Vpgm is applied to dummy cell TC adjacent to the selected memory cell MC having been subjected to preliminary programming within the same cell group GM.

Each cell group GM is separated from one another in the X direction by distance W1, whereas within the same cell group GM, memory cell MC responsible for data retention and dummy cell TC responsible for threshold voltage adjustment are separated by distance W2 which is less than distance W1. Thus, high capacitance is observed in floating gate electrodes FG of memory cell MC and dummy cell TC adjacent to each other in the same cell group GM. Accordingly, memory cells MC having their threshold voltages Vt raised into distribution B are more susceptible to being affected by the cross coupling effect originating from the charge stored in dummy cell TC, whereby threshold voltage Vt of memory cells MC are further raised from distribution B to distribution A as illustrated in FIG. 10A. Because cell groups GM are separated by distance W1 which is greater than W2, cross coupling effect is substantially suppressed between different cell groups GM.

Then, at step T5, control circuit CC determines whether or not threshold voltage Vt of memory cell MC is greater than verify voltage Vvfy, and if not (T5: NO), voltage Vpgm of dummy cell TC is incremented by step voltage ΔVpgm and the process returns to T4 to repeat the programming. Once threshold voltage Vt of memory cell MC has exceeded verify voltage Vvfy (T5: YES), control circuit CC terminates the programming process.

Verification is carried out for memory cells MC but not for dummy cells TC. This is because threshold voltage Vt of memory cells MC may vary cell by cell by structural variance. Thus, memory cells MC which are used for data retention are preferably verified for reliability.

Figure 11:
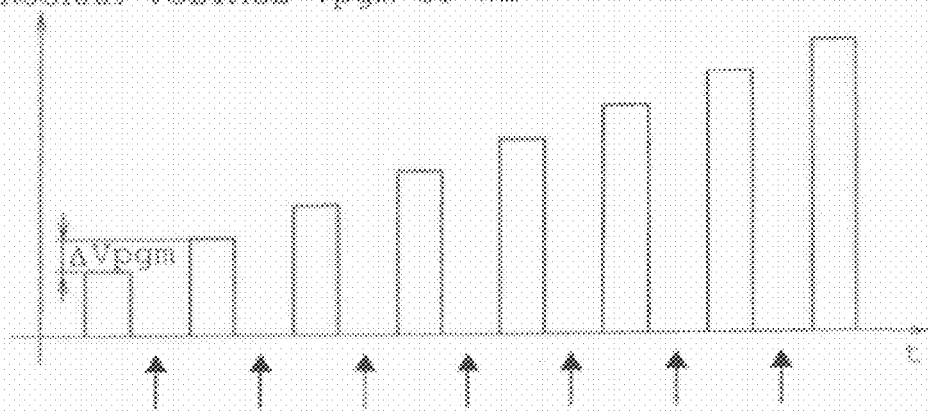
FIG. 11 is a chart exemplifying a stepped program process or more specifically, an incremental voltage pulse scheme according to the first embodiment.

FIG. 11 shows how voltage applied by incremental voltage pulse scheme changes over time. In stepped voltage application, voltage is stepped up by ΔVpgm e.g. 0.3V, 0.5V, and 0.6V after every cycle as indicated in the arrow of FIG. 11. Stepped voltage application allows the amount of shift in threshold voltage to be substantially constant over time of voltage application. By setting ΔVpgm in a small amount, adjustment of the threshold voltage can be made in small amounts to allow the desired threshold voltage distribution, exemplified as distribution A in the first embodiment, to span over a small range.

By applying voltage to dummy cell TC by stepped voltage application scheme, threshold voltage Vt of the selected memory cell MC is adjusted within the desired threshold voltage distribution, in this case, distribution A. Using this scheme, control circuit CC applies voltages incremented by ΔVpgm to dummy cell TC to allow, by principle, elevate threshold voltage Vt of dummy cell TC by margins approximating ΔVpgm. Threshold voltage Vt of memory cells MC within the same cell group GM as dummy cells TC is adjusted by the cross coupling effect originating from dummy cell TC such that threshold voltage Vt is raised in a step voltage smaller than step voltage ΔVpgm as can be seen by comparing the degree of increase in threshold voltages Vt of memory cell MC and dummy cell TC. As a result, threshold voltage can be readily fine tuned even when step voltage ΔVpgm is roughly specified.

Multiplicity of memory cells MC are not uniform in terms of their properties such as program speed, and thus, may not have the same count of step voltage application during programming. In such case, threshold voltages Vt of memory cells MC may be adjusted within the narrow distribution range slightly greater than verify voltage Vvfy. Programming is repeated until all the required pages have been written.

Figure 12:
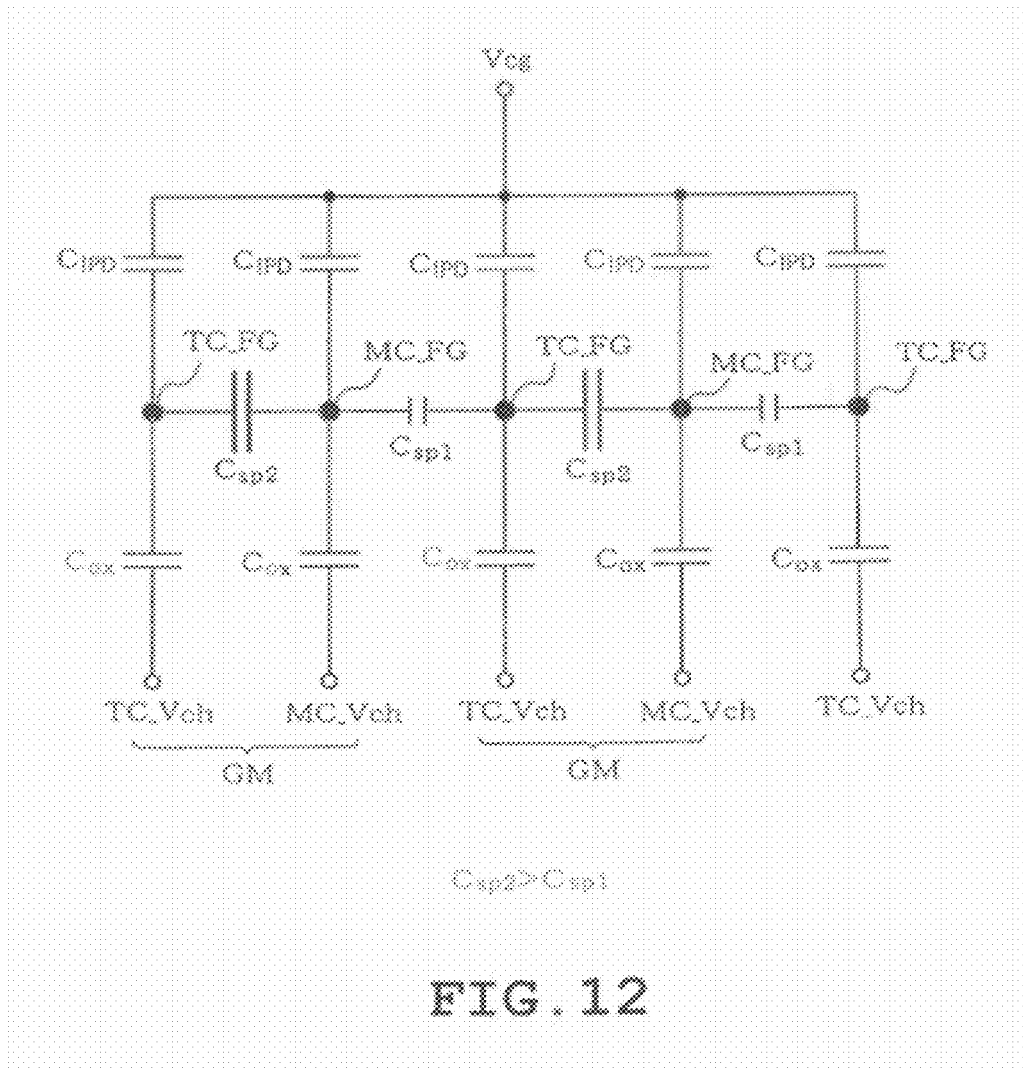
FIG. 12 is a diagram indicating the capacitance between the nodes according to the first embodiment.

FIG. 12 indicates the capacitance between each of the nodes situated in the proximity of each floating gate electrodes FG neighboring in the X direction. In FIG. 12, TC_FG indicates floating gate electrode FG of dummy cell TC, MC_FG indicates floating gate electrode FG of memory cell MC, Vcg indicates the voltage applied to control gate electrode CG, TC_Vch indicates the channel voltage of dummy cell TC, and MC_Vch indicates the channel voltage of memory cell MC.

$C_{IPD}$ indicates the capacitance between floating gate electrode FG and control gate electrode CG confronting each other over intergate insulating film 4, and Cox indicates the capacitance between floating gate electrode FG and the channel of semiconductor substrate 2 confronting each other over gate insulating film 3. Further, Csp1 indicates the capacitance between the adjacent floating gate electrodes FG confronting each other over element isolation insulating film 6a, and Csp2 indicates the capacitance between the adjacent floating gate electrodes FG confronting each other over element isolation insulating film 6b.

Because second width W2 of element isolation insulating film 6b is narrower than first width W1 of element isolation insulating film 6a, capacitance Csp2 is greater than capacitance Csp1 as indicated in FIG. 12. Because relatively greater cross coupling effect operates between the adjacent memory cells MC and dummy cells TC within the same cell group GM, high voltage applied to dummy cells TC within a given cell group MG causes elevation of threshold voltage Vt of memory cells MC within the same cell group MG.

Adjustments can be made in threshold voltages Vt of memory cells MC by positively utilizing the cross coupling effect. Step voltage Vpgm is not directly applied to the selected memory cell MC, in other words, the programming target. Thus, gate insulating film 3 and intergate insulating film 4 of memory cell MC is only subjected to weak programming stress. According to such arrangement, degradation of memory cells MC induced by voltage application stress can be prevented to improve the reliability of memory cells MC.

In the first embodiment, control circuit CC applies voltage to dummy cell TC adjacent to the selected memory cell MC for programming and utilizes the cross coupling effect for adjusting threshold voltage Vt of memory cell MC to the desired threshold voltage distribution which is exemplified as distribution A in the first' embodiment.

According to such configuration, even if memory cells MC are subjected to the risk of increased distribution range of programming threshold due to threshold voltage Vt variance caused by irregularities in impurity diffusion, dimension or shape variance, and program noise, adjustments can be made in threshold voltage Vt of memory cells MC by applying voltage to dummy cell TC by proxy, to narrow the ultimate distribution range of threshold voltage as exemplified as distribution A. Thus, data reliability can be improved by the provision of dummy cells TC used for threshold voltage adjustment. Further, because distribution range of threshold voltage Vt of memory cell MC, in this case, the range of distribution A can be narrowed, greater threshold margin can be obtained as well as increasing the speed of programming.

Control circuit CC carries out preliminary programming to the selected memory cell MC, having threshold voltage Vt within the range of distribution E indicative of the erase state, in order to tentatively adjust threshold voltage Vt into distribution B, whereafter threshold voltage Vt is adjusted into the desired threshold voltage distribution exemplified as distribution A. Such stepped programming is advantageous in that only small voltages needs to be further applied to control threshold voltage Vt from the preliminary programming distribution, i.e. distribution B to the desired threshold voltage distribution, i.e. distribution A, thereby facilitating adjustment of threshold voltage Vt into the desired threshold voltage distribution, i.e. distribution A which is, preferably minimized in range as much as possible.

Further, control circuit CC, after carrying out a preliminary programming on the selected memory cell MC, employs stepped voltage application scheme to apply gradually raised voltages to dummy cell TC to adjust threshold voltage Vt of the selected memory cell MC into the desired threshold voltage distribution, i.e. distribution A. Thus, threshold voltage Vt can be fine tuned into threshold voltage distribution, i.e. distribution A made as narrow as possible.

Memory cell array Ar includes multiplicity of substantially identical cell structures. The multiplicity of cells are configured by memory cell MC and dummy cell TC associated with each memory cell MC, meaning that memory cell array Ar contain substantially equal number of memory cell MC and dummy cell TC. Thus, using dummy cells TC for threshold adjustment improves the reliability of data programming.

Further, memory cell MC and dummy cell TC within the same cell group GM are separated by distance W2 which closer compared to distance W1 which is the distance between two adjacent cell groups GM. Thus, cross coupling effect between two adjacent cell groups GM can be substantially ignored. In other words, voltage application to a given dummy cell TC within one cell group GM will not affect other cell groups GM through cross coupling effect.

Because control circuit CC swaps memory cell MC with dummy cell TC after memory cell MC has been programmed/ erased for predetermined times, stress suffered by the cells within the entire memory cell array Ar can be evened out.

Next, a description will be given on the method of fabricating the above described cell groups GM.

FIGS. 13 to 22 indicate the process flow for fabricating cell groups GM. FIGS. 13 to 22 are schematic and do not provide details that are not essential.

Figure 13:
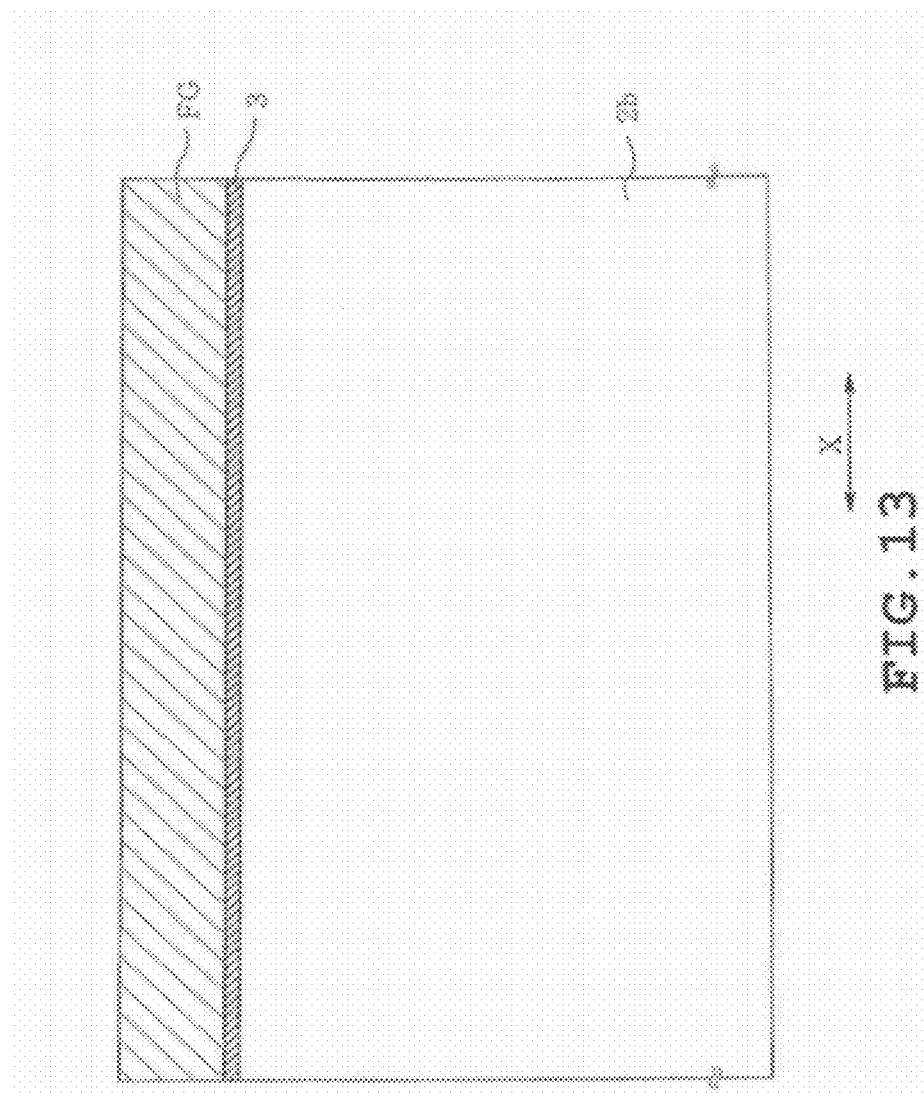
FIGS. 13 to 22 each schematically illustrates one phase of the manufacturing process flow of a NAND flash memory device according to the first embodiment.

Referring to FIG. 4, wells 2a and 2b are formed in the surface layer of semiconductor substrate 2. Then, as shown in FIG. 13, gate insulating film 3, a film serving as floating gate electrode FG are formed in the listed sequence above semiconductor substrate 2. Semiconductor substrate 2 is made of semiconductor materials such as silicon.

Gate insulating film 3 is typically made silicon oxide film formed through processes such as thermal oxidation, plasma oxidation, and CVD (Chemical Vapor Deposition). Floating gate electrode FG is typically made of polycrystalline silicon film formed, for instance, by CVD and thereafter doped with impurities.

Figure 14:
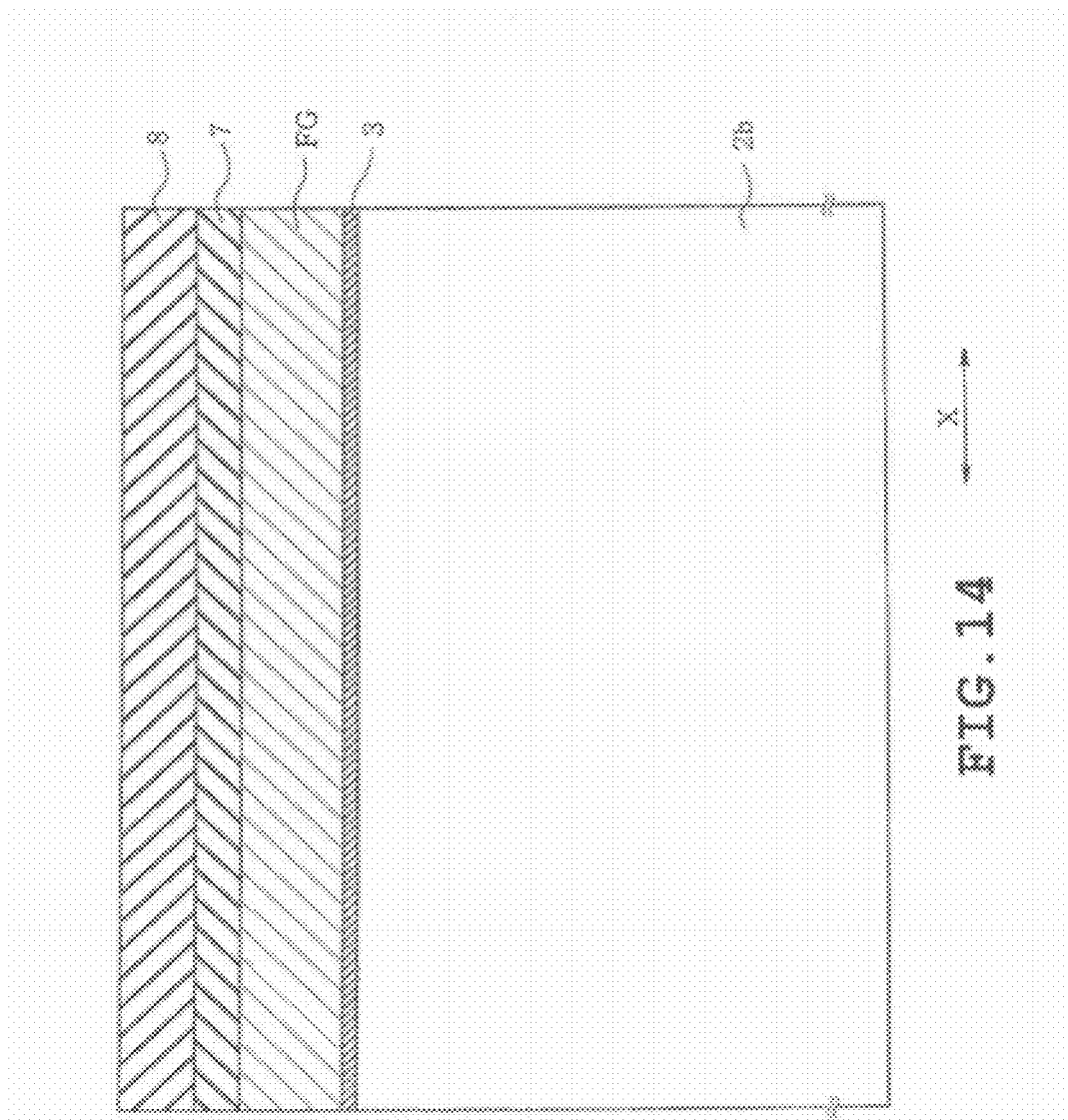

Then, masks are formed for formation of element isolation trenches 5. The masks are formed by double patterning techniques such as SWT (Sidewall Transfer) Process to obtain sublithographic patterns. For instance, as shown in FIG. 14, masks 7 and 8 are formed above floating gate electrode FG film in the listed sequence typically by CVD. Mask 7 is typically made of silicon nitride film or silicon oxide film. Masks 7 and 8 possess etching selectivity to one another and are made of different materials. For instance, if mask 7 is made of silicon nitride film, mask 8 is made of silicon oxide film or amorphous silicon film, whereas if mask 7 is made of silicon oxide film, mask 8 is made of silicon nitride film or amorphous silicon film.

Figure 15:
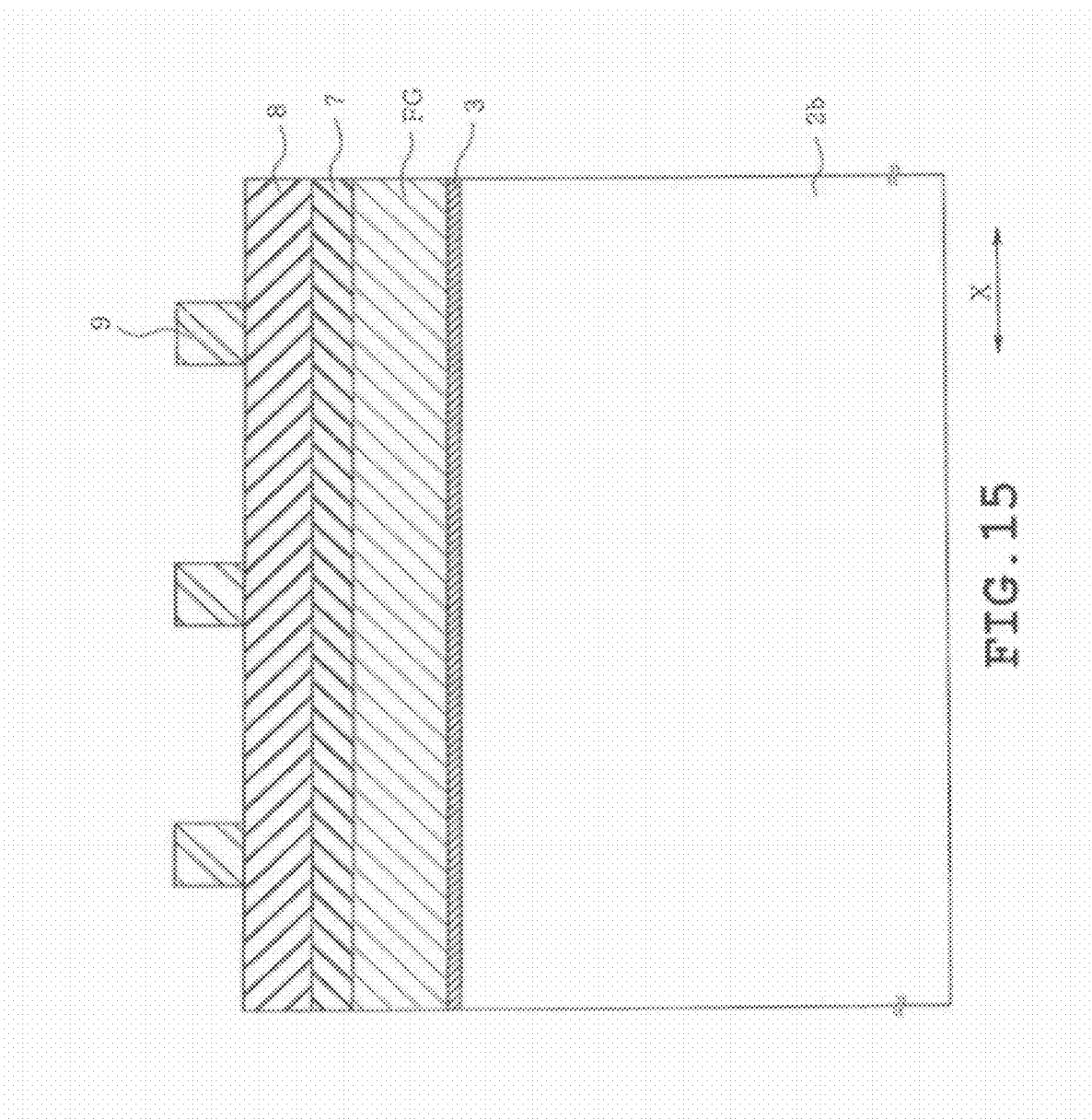

Mask 8 serves as a core in SWT process. As can be seen in FIG. 15, resist pattern 9 is formed by lithography for patterning mask 8. Resist pattern 9 has a pitch that is twice as wide as the final pitch of memory cell MC, which is, in this case, W1+W2.

Figure 16:
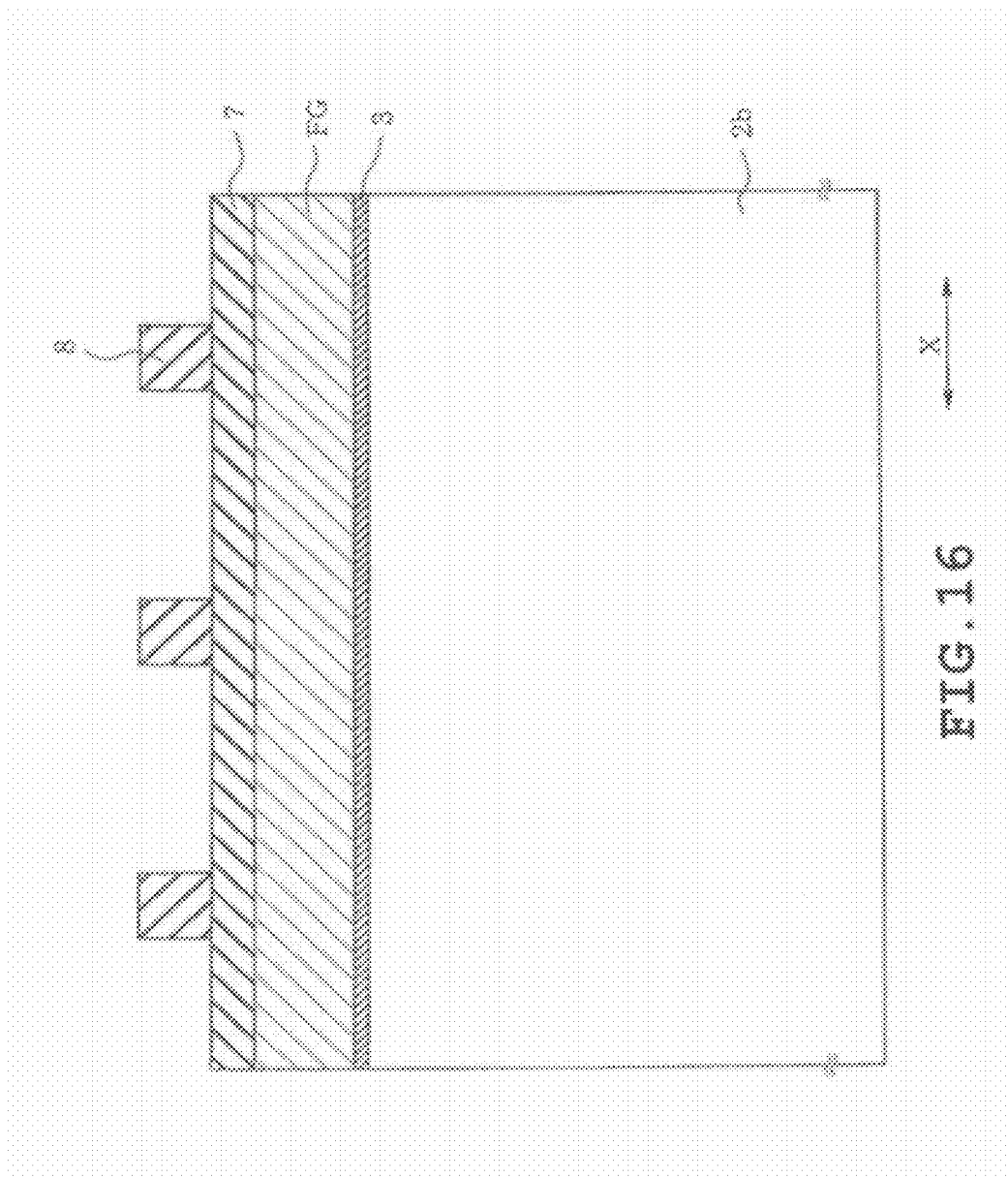

Next, referring to FIG. 16, mask 8 is patterned using resist pattern 9 as a mask, whereafter resist pattern 9 is removed.

Figure 17:
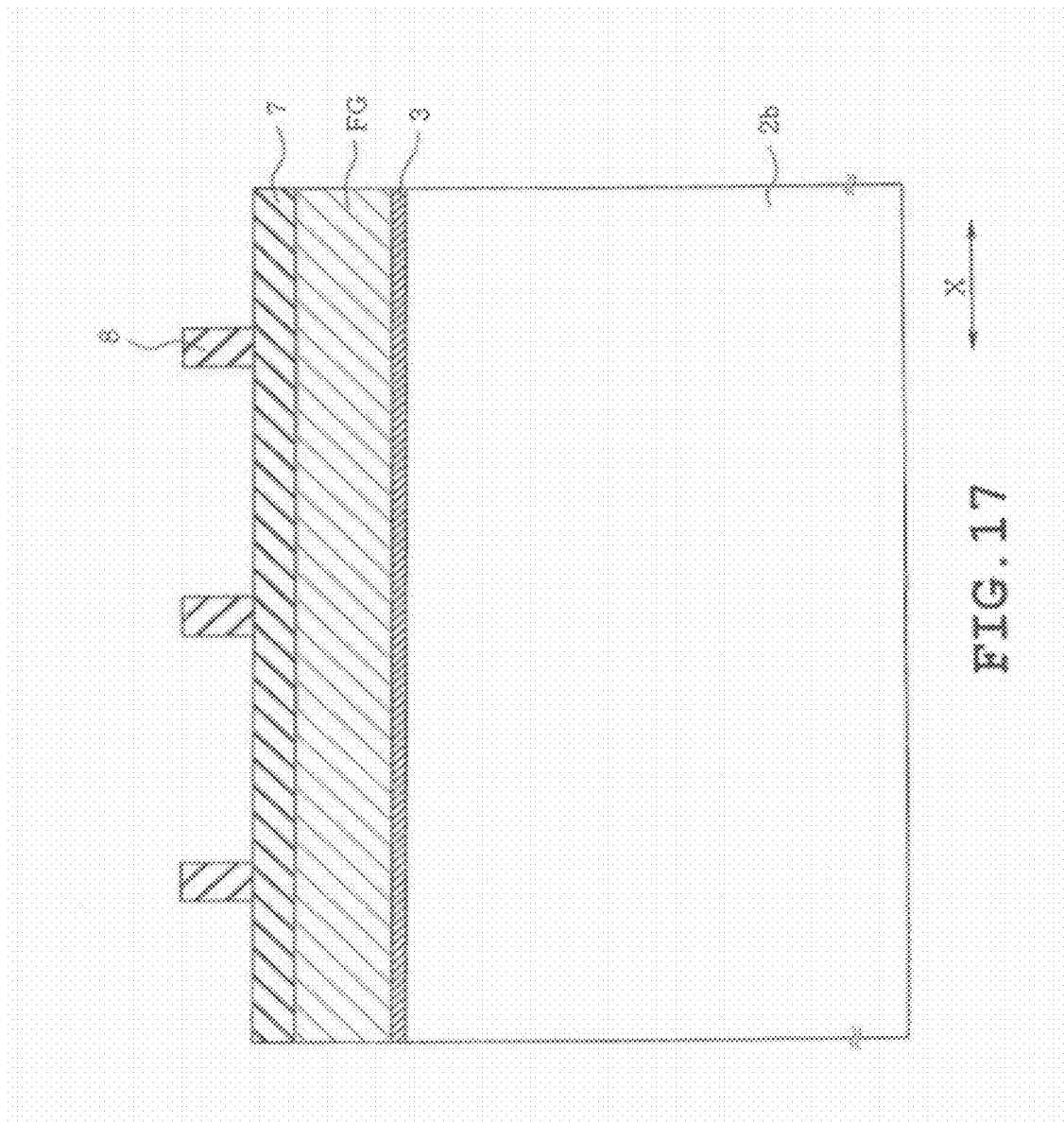

Then, as shown in FIG. 17, mask 8 serving as the core is slimmed. The slimmed mask 8 has a width corresponding to the width of element isolation region 5 and is obtained by making process dependant modifications for correcting errors such as etching errors to Width W2. For instance, mask 8 is slimmed to a width which is equal to or narrower than 25% of the width of resist pattern 9.

Figure 18:
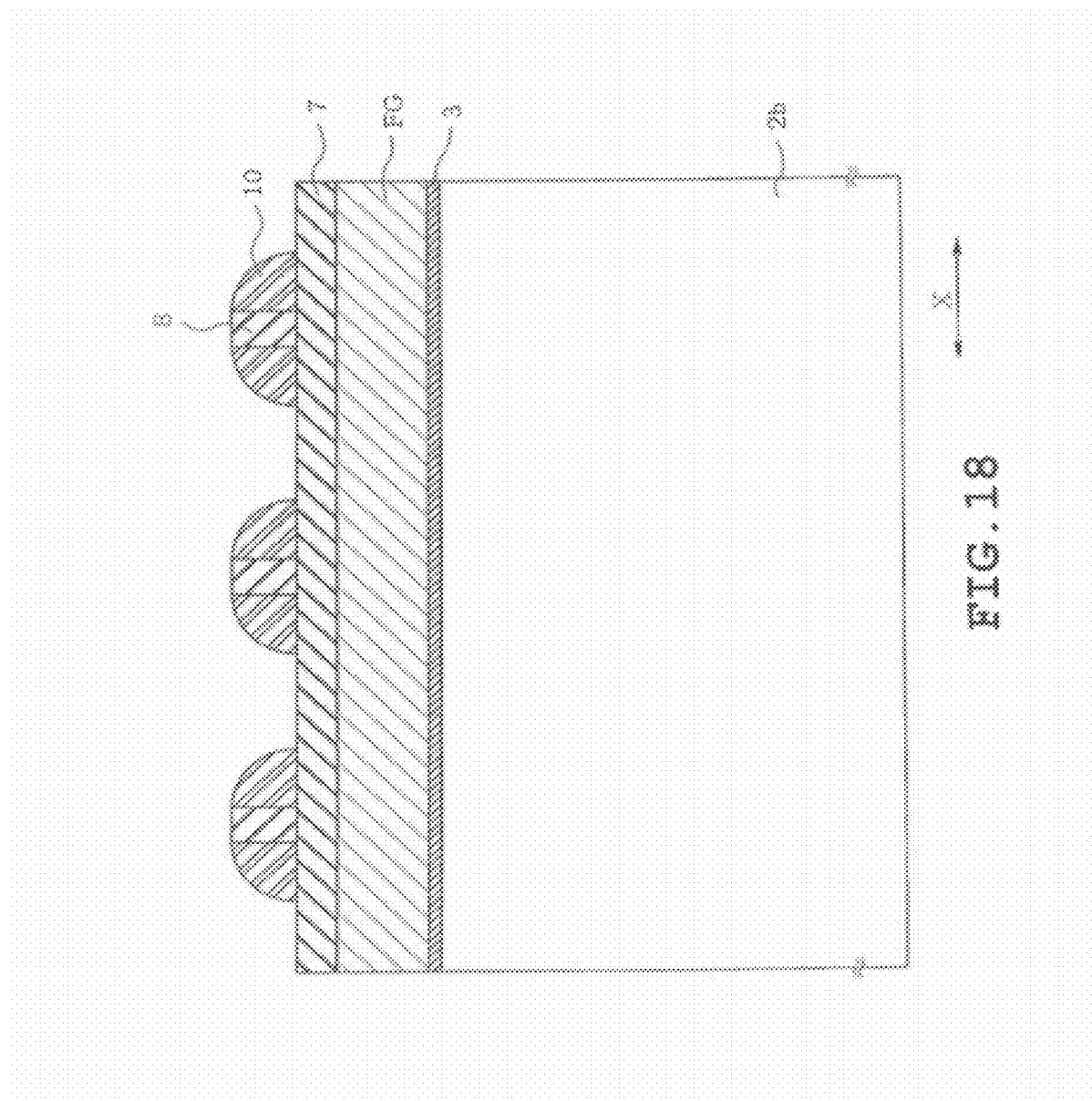

Then, as shown in FIG. 18, sidewall film 10 is formed along the sidewall of mask 8. Sidewall film 10 serves as a mask for forming element isolation trench 5. Though not shown, sidewall film 10 may be formed by covering floating gate electrode FG film, mask 7, and mask 8 with film 10 after slimming mask 7 and thereafter anisotropically etching film 10 so as to remain along the sidewall of mask 8.

Figure 19:
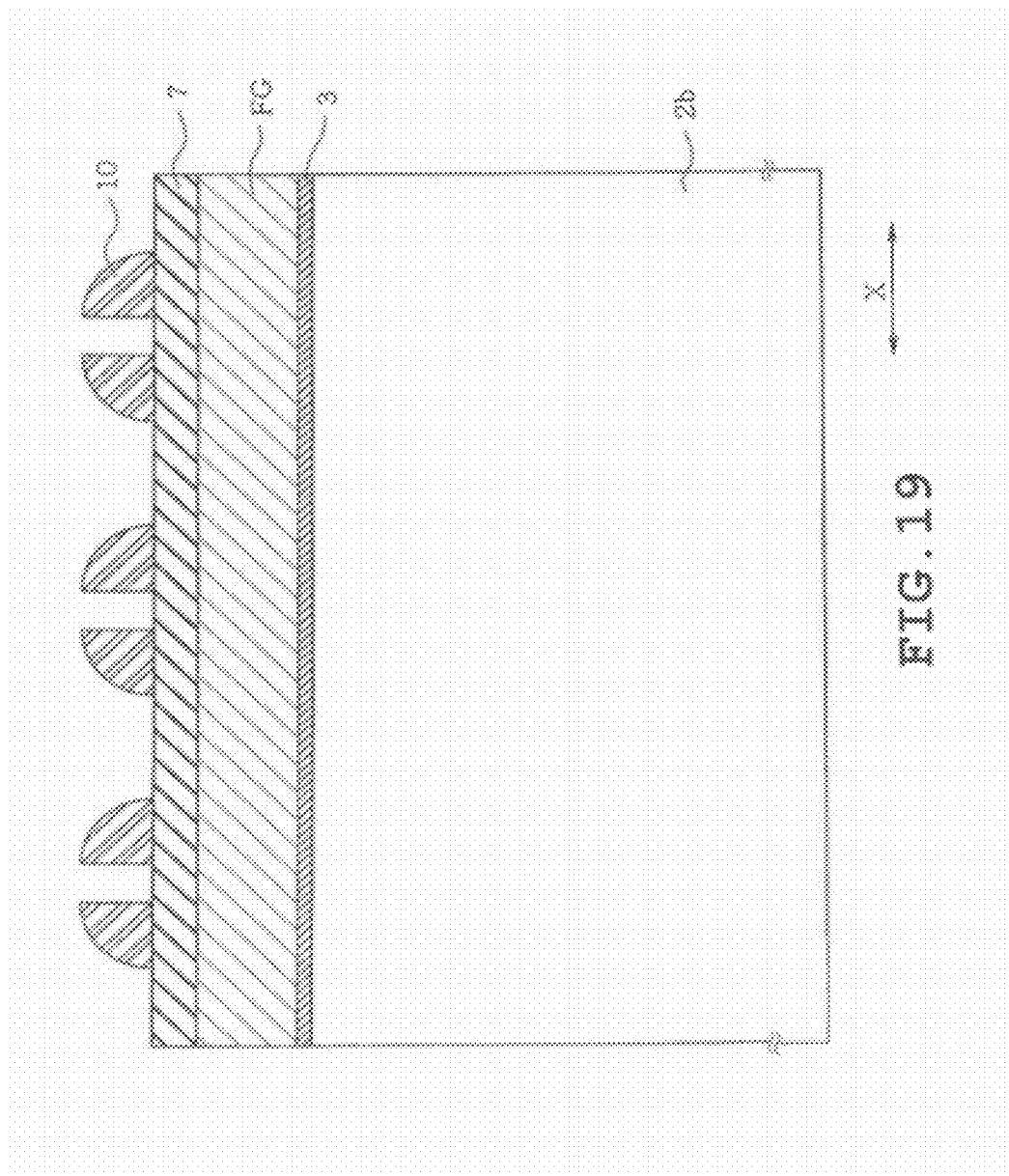

Then, as shown in FIG. 19, mask 8 is typically removed by wet etching while leaving sidewall film 10 unremoved.

In regions other than memory cell array Ar such as the peripheral circuit region in which elements such as row drive circuit RD, column drive circuit CD, and control circuit CC are formed, mask 8 may not have to be removed. In such case, additional masks may be formed by photoresist in such regions prior to removing mask 8 in memory cell array Ar.

Figure 20:
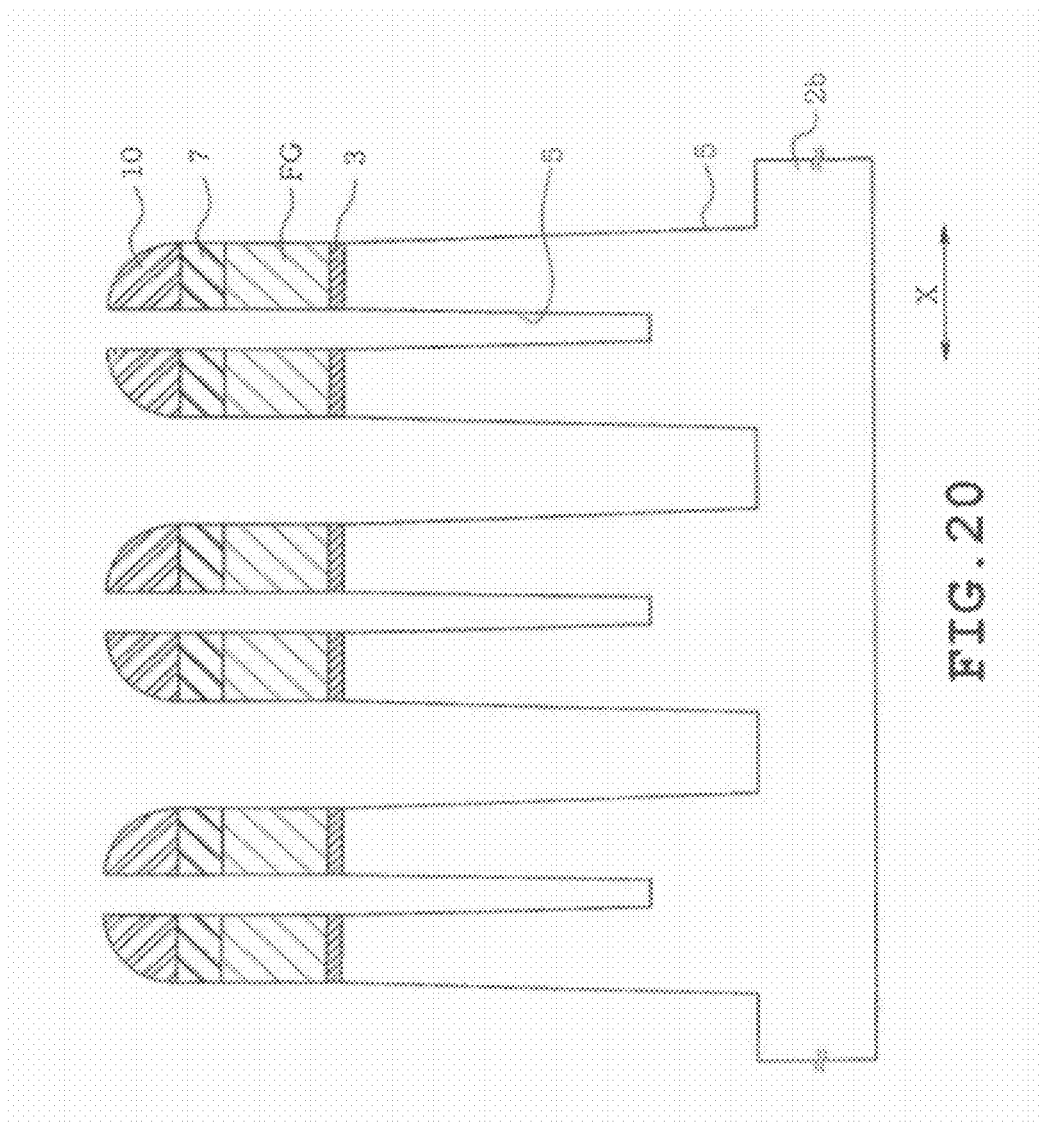
Figure 21:
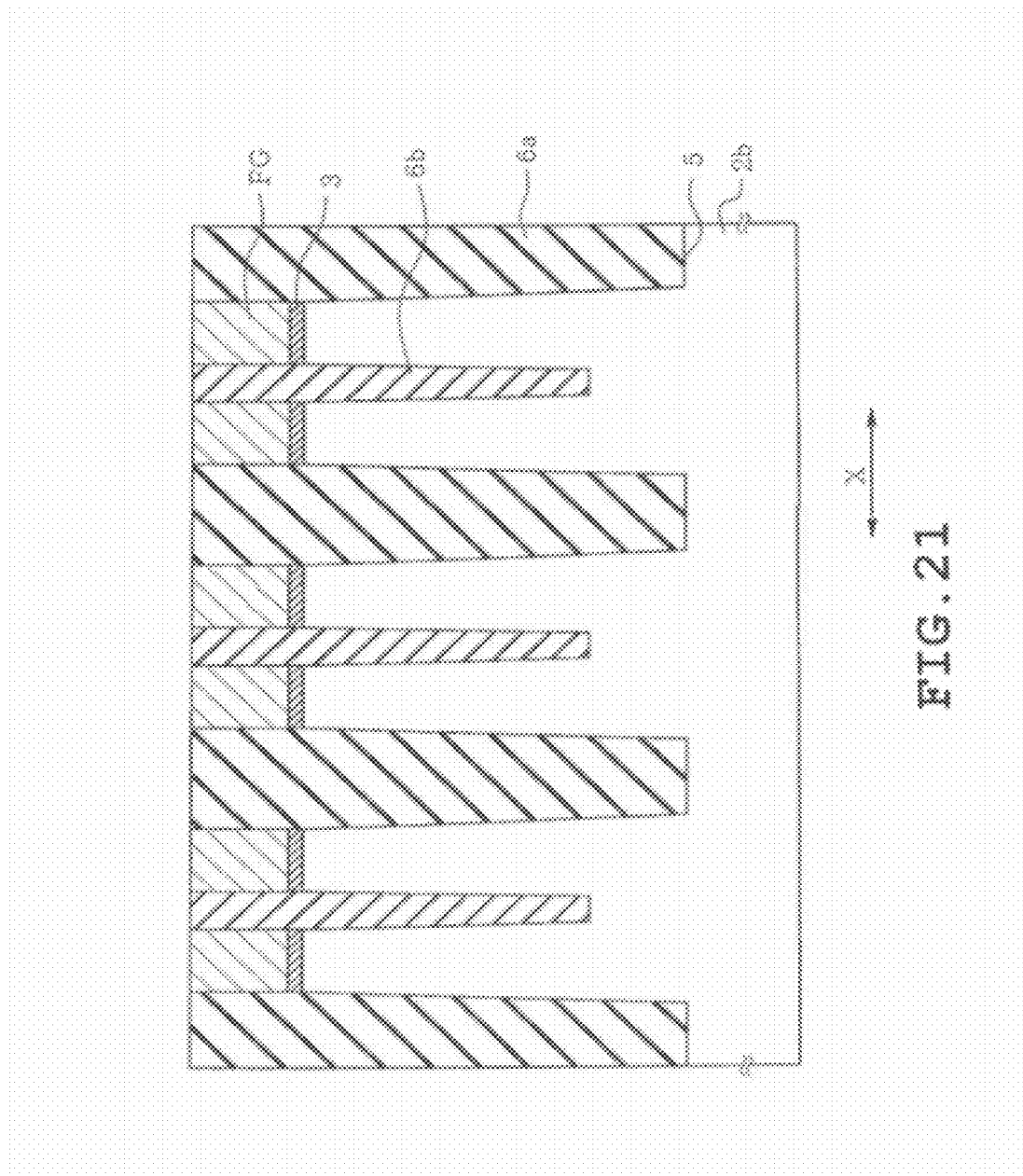

Next, referring to FIG. 20, sidewall film 10 is used as a mask for etching mask 7, floating gate electrode FG film, gate insulating film 3, and p well 2b within semiconductor substrate 2 to form element isolation trench 5. RIE (Reactive Ion Etching) is employed in this case such that etching progressing anisotropically.

The depth of element isolation trench 5 relies on its width such that element isolation trenches 5 located between relatively closely spaced sidewall films 10 are shallow, whereas element isolation trenches 5 located between relatively distantly spaced sidewall films 10 are deep. This is due to the microloading effect of etching.

Next, sidewall film 10 and mask 7 are removed and element isolation trench 5 is filled with element isolation insulating films 6a and 6b. Element isolation insulating films 6a and 6b may be made of a silicon oxide film which may be filled into trench 5 by CVD, or a coating film spin coated into trench 5 by SOG and thereafter transformed into a silicon oxide film. After overfilling trench 5, the upper surfaces of element isolation insulating films 6a and 6b may be planarized by CMP (Chemical Mechanical Polishing) to obtain the structure shown in FIG. 21.

Figure 22:
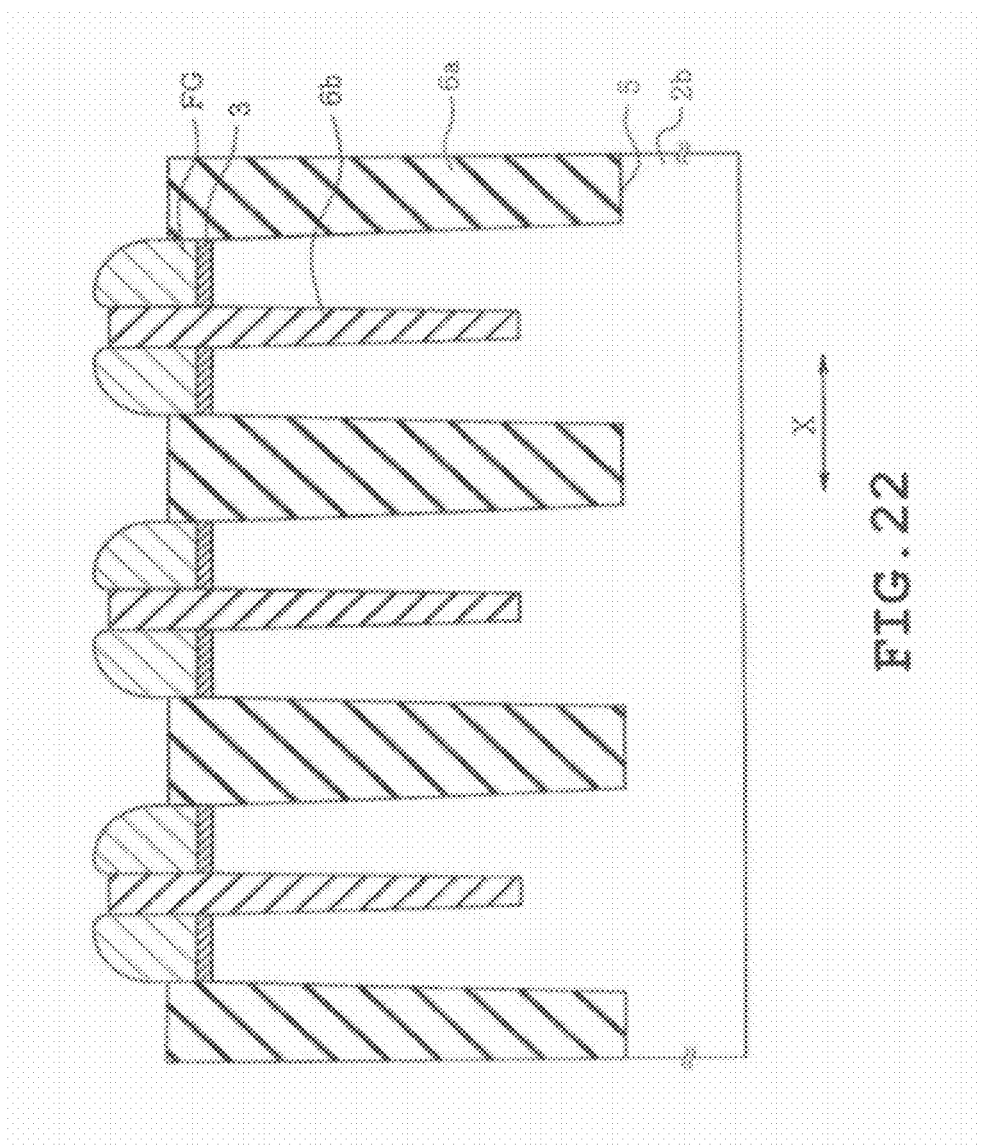

Then, as shown in FIG. 22 element isolation insulating films 6a and 6b are etched until they are lowered below the height of floating gate electrode FG. The height of element isolation insulating films 6a and 6b rely on their widths and thus, element isolation insulating film 6a which is relatively wider results in lower upper surface, whereas element isolation insulating film 6b which is relatively narrower results in higher upper surface.

The upper portion of floating gate electrode FG protruding upward from the upper surface of element isolation insulating films 6a and 6b are etched into round upper corners when proper etching selectivity is specified as can be seen in FIG. 22.

Next, referring back to FIG. 5, intergate insulating film 4 and word lines WL are formed in the listed sequence. Intergate insulating film 4 typically comprises an ONO (Oxide-Nitride-Oxide) or an NONON (Nitride-Oxide-Nitride-Oxide-Nitride) structure typically formed by stacking silicon oxide film and silicon nitride film by CVD. Alternatively, high dielectric constant film having dielectric constant higher than aluminum oxide may be interposed between the stack of silicon oxide film and silicon nitride film. Word line WL comprises a polycrystalline silicon layer formed by CVD and a silicide layer, which is obtained by siliciding the upper portion of the polycrystalline silicon with metal. Word line WL may be a stack of metal and polycrystalline silicon as well.

Next, referring to FIG. 4, gate electrodes SGD, SGS, MG, TG, and DG are separated in the Y direction. The separation of the gate electrodes are done by anisotropic etching such as RIE. Though not shown in FIG. 4, interlayer insulating film not shown is filled in the gaps between gate electrodes SGD, SGS, MG, TG, and DG. The interlayer insulating film may comprise a silicon oxide film formed by CVD.

Next, as shown in FIG. 4, contact holes are formed through the interlayer insulating film to expose the upper surface of semiconductor substrate 2. Inside the contact holes, bit line contact CB and source line contact CS are formed, and above bit line contact CB and source line contact CS, bit line BL is formed. Bit line contact CB and source line contact CS comprises a combination of conductive film and poly plug. An example of conductive film may be a combination of a barrier film made of titanium nitride (TiN) and a metal liner such as tungsten (W) and an example of poly plug material may be polycrystalline silicon. The subsequent processes are not essential to the first embodiment and thus, will not be described.

By employing the above described process flow, the structure of the first embodiment can be obtained even in sublithographic design rules, which is further advantageous in providing NAND flash memory device 1 that runs faster with improved reliability.

Figure 23:
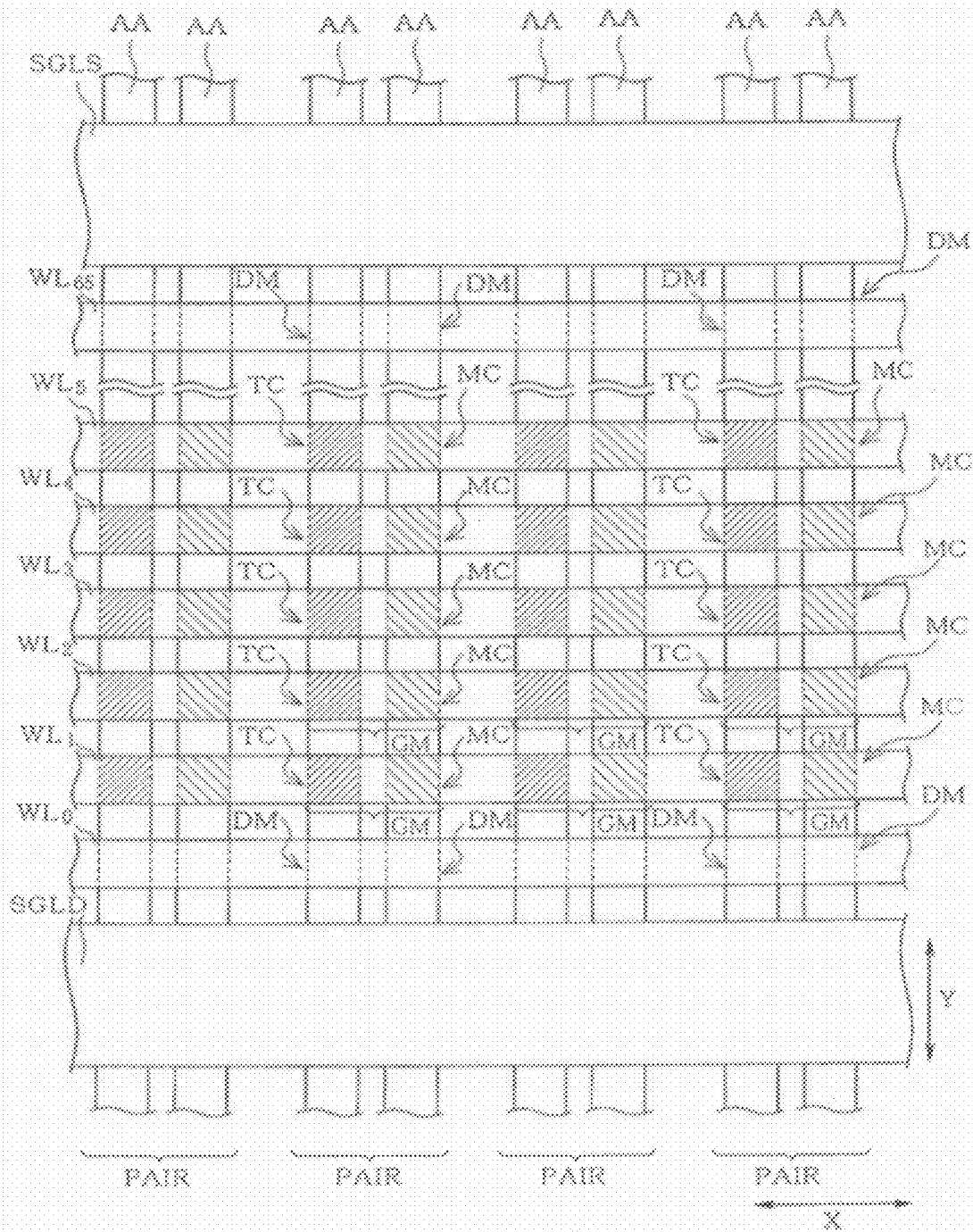
FIG. 23 corresponds to FIG. 3 and illustrates a second embodiment.

FIG. 23 illustrates a second embodiment which differs from the first embodiment in that, a plurality of memory cells MC are formed adjacent to one another in one of the pair of active areas AA, whereas a plurality of dummy cells TC are formed adjacent to one another in the remaining other of the pair of active areas AA. The elements that are identical or similar to the first and the second embodiments are identified with identical or similar reference symbols and will not be re-described.

Control circuit CC assigns the task of memory cell MC/dummy cell TC to a given cell by modifying the allocation flag buffer.

According to the second embodiment, memory cells MC and dummy cells TC within the same cell group GM can be located adjacent to one another and thus, the advantageous of the first embodiment can be achieved through the second embodiment as well.

Because programming proceeds page by page from page 1 (word line $WL_1$), programming of page k (word line $WL_k$) affects the threshold voltage of memory cell MC programmed in the previous page k−1 (word line $WL_{k-1}$).

Thus, threshold voltage Vt of memory cell MC is not only affected by the X directionally adjacent dummy cell TC but also Y directionally adjacent cells and thus varies its level by cross coupling effect.

Because the allocation or layout of memory cell MC and dummy cell TC differs between first and the second embodiment, memory cell MC is affected differently in the first and the second embodiments. Either the cell allocation/layout of the first or the second embodiment may be preferable over the other depending upon the cell structure and how threshold voltage Vt is designed. Thus, the layout may be modified depending by usage and design.

FIGS. 24 to 35 illustrate a third embodiment which differs from the first and the second embodiments in that a single cell group GM comprises three active areas such that memory cell MC located in the central active area AA interposes two X-directionally adjacent dummy cells TC located in the two outer active areas AA. The elements that are identical or similar to the first and the second embodiments are identified with identical or similar reference symbols and will not be re-described. The following description will be directed primarily on the differences from the first and second embodiments.

Figure 24:
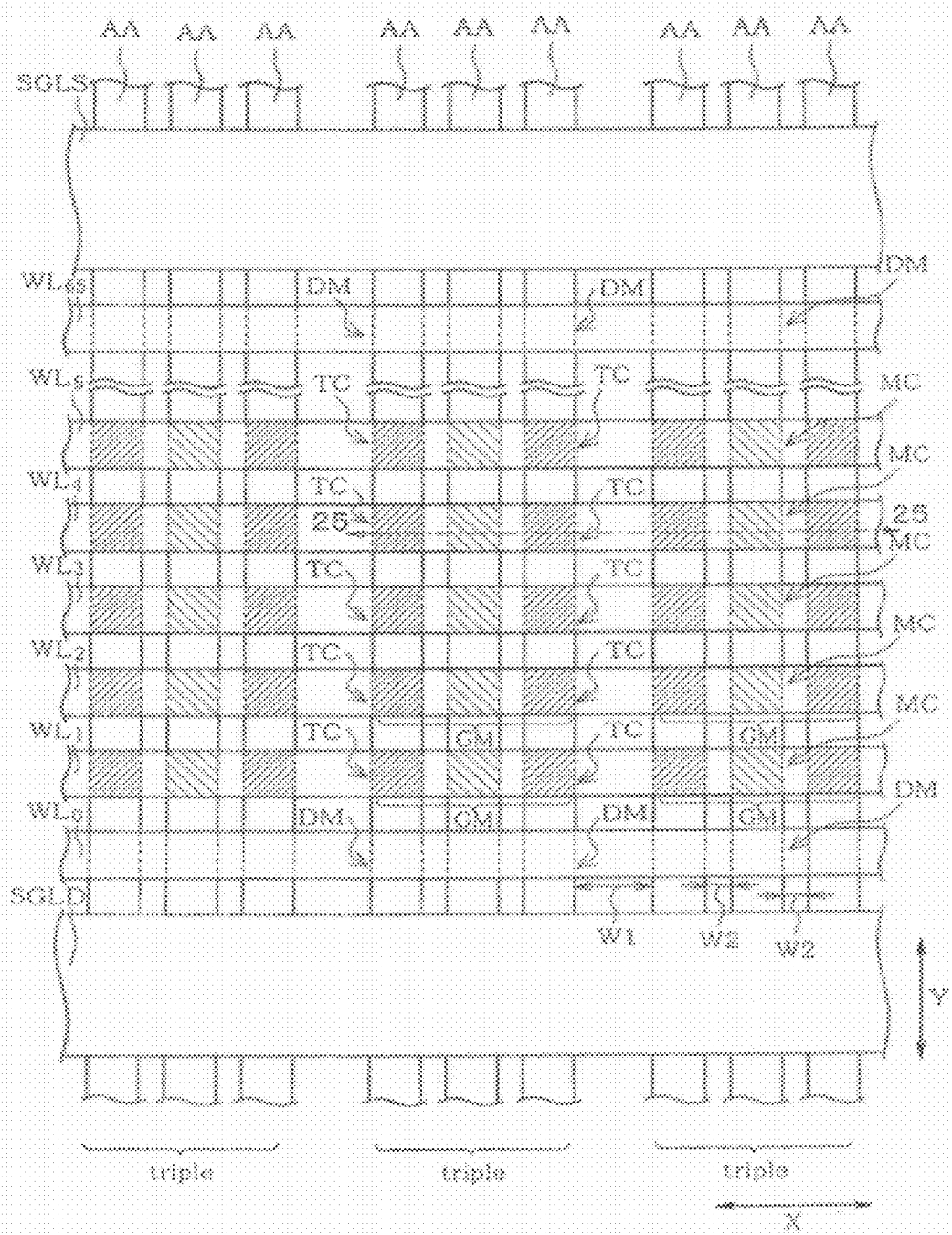
FIG. 24 corresponds to FIG. 3 and illustrates a third embodiment.
Figure 25:
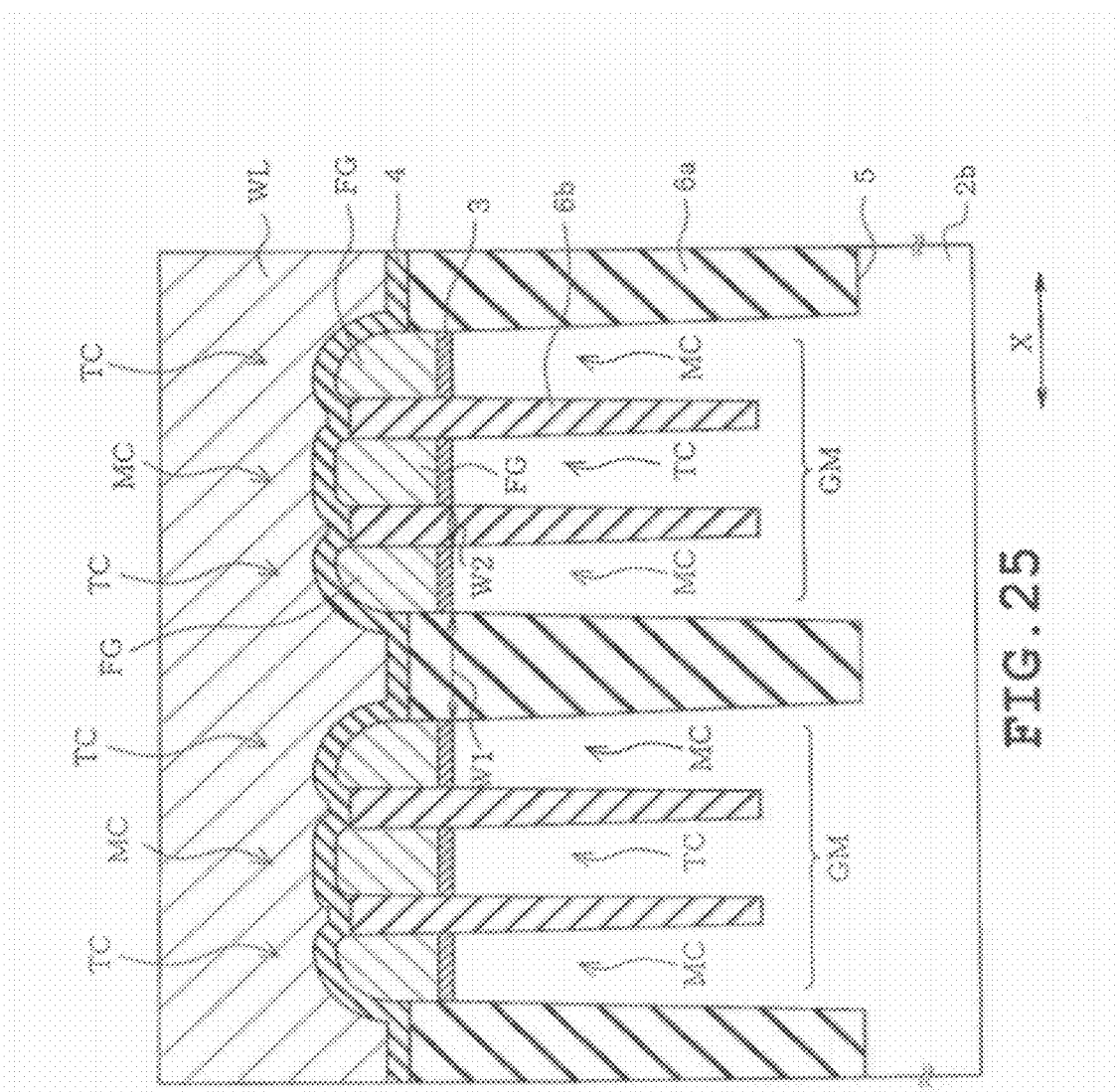
FIG. 25 corresponds to FIG. 5 and illustrates the third embodiment.

FIG. 24 is a plan view corresponding to FIG. 3 and FIG. 25 is a vertical cross sectional view corresponding to FIG. 5 taken along line 25-25 of FIG. 24. FIG. 5 according to the first and the second embodiments showed two active areas AA adjacent to one another in the X direction with width W2 therebetween. The third embodiment, as can be seen in FIG. 24 has three Y-directionally extending active areas AA adjacent to one another in the X direction with width W2 therebetween. The cross sectional view of FIG. 25 shows that floating gate electrodes FG are formed above the three active areas AA by way of gate insulating film 3 and word line WL is further formed above floating gate electrode FG by way of intergate insulating film 4.

Each cell group GM is provided with a row of memory cells MC in the central active area AA and a row of dummy cells TC in active areas AA located at both X-directional sides of the central active area AA. Floating gate electrodes FG of memory cells MC are configured to be higher than the floating gate electrode FG of dummy cells TC. Cell groups GM are isolated from one another by width W1.

Control circuit CC makes adjustments in threshold Vt of memory cell MC by simultaneously applying voltage to dummy cells TC used for threshold voltage adjustment provided at both sides of memory cell MC after performing preliminary programming on the central memory cell MC. As a result, voltage can be applied from both sides of memory cell MC and thus, the threshold voltage of dummy cell TC used for threshold voltage adjustment need not be raised as much as the first and the second embodiment, to advantageously reduce the voltage application stress of dummy cell TC.

The method of fabricating the structure according to third embodiment will be described focusing primarily on the differences from the first and the second embodiments. According to the third embodiment, the masks used for formation of element isolation trenches 5 are formed by triple patterning techniques employing SWT process to obtain sublithographic patterns.

Figure 26:
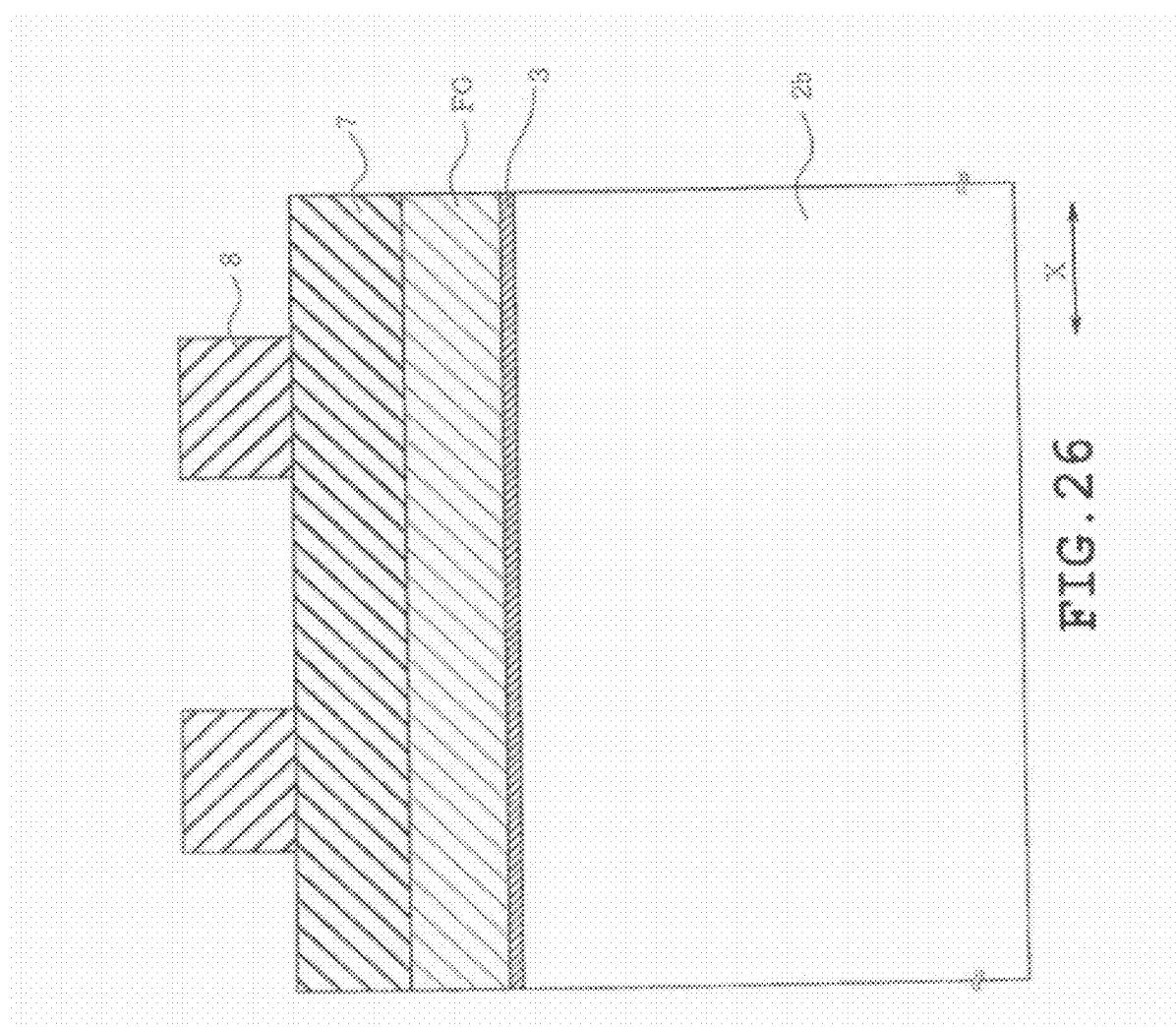
FIGS. 26 to 35 each schematically illustrates one phase of the manufacturing process flow of a NAND flash memory according to the third embodiment.

As can be seen in FIG. 26, the process flow followed up to the formation of mask 8 through formation of resist pattern not shown by normal lithography process and anisotropically etching the resist pattern is the same as those of the first embodiment.

Figure 27:
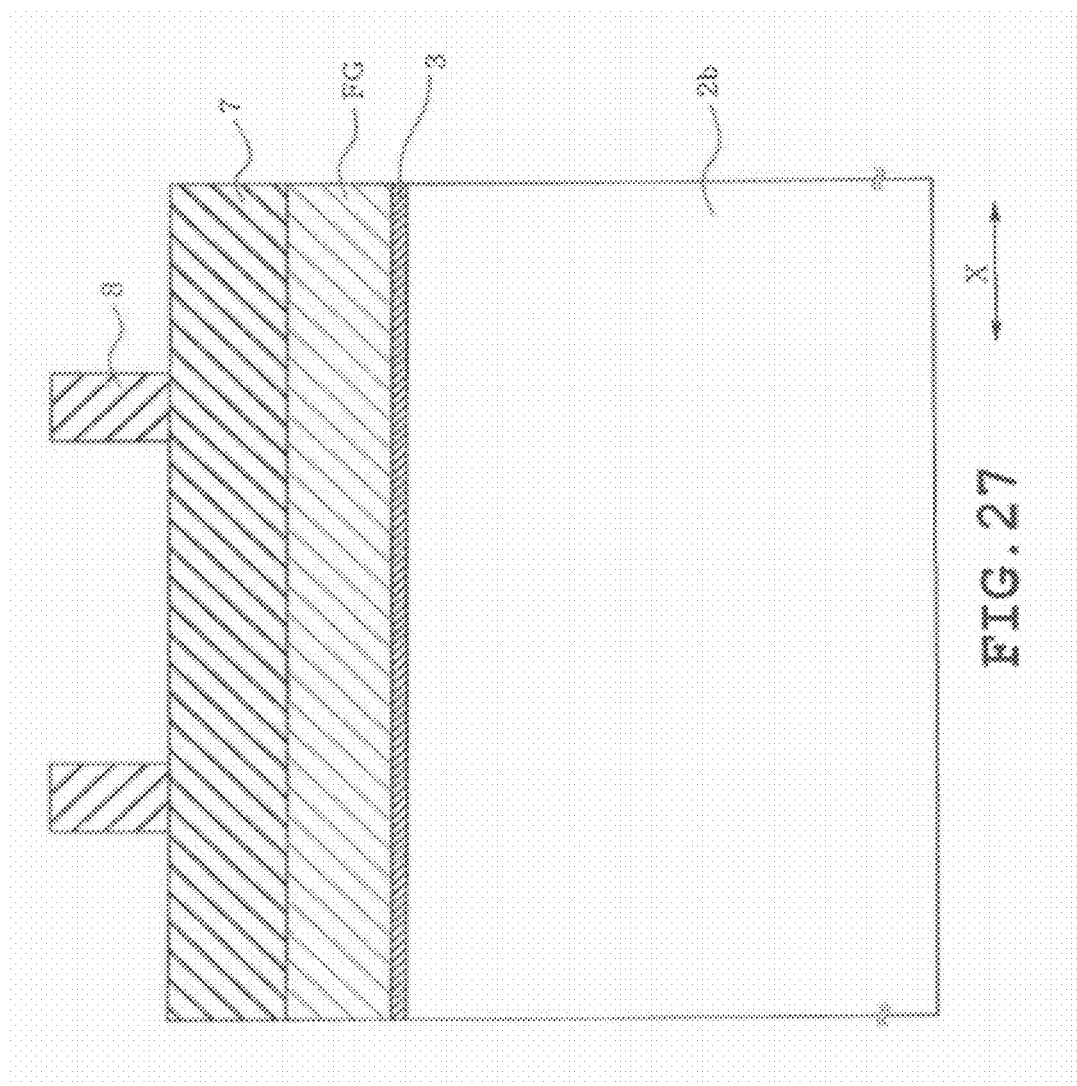

Then, as shown in FIG. 27, mask 8 is slimmed to a width corresponding to the resulting width of gate electrode MG of memory cell MC which is obtained by making process dependant modifications for correcting errors such as etching errors.

Figure 28:
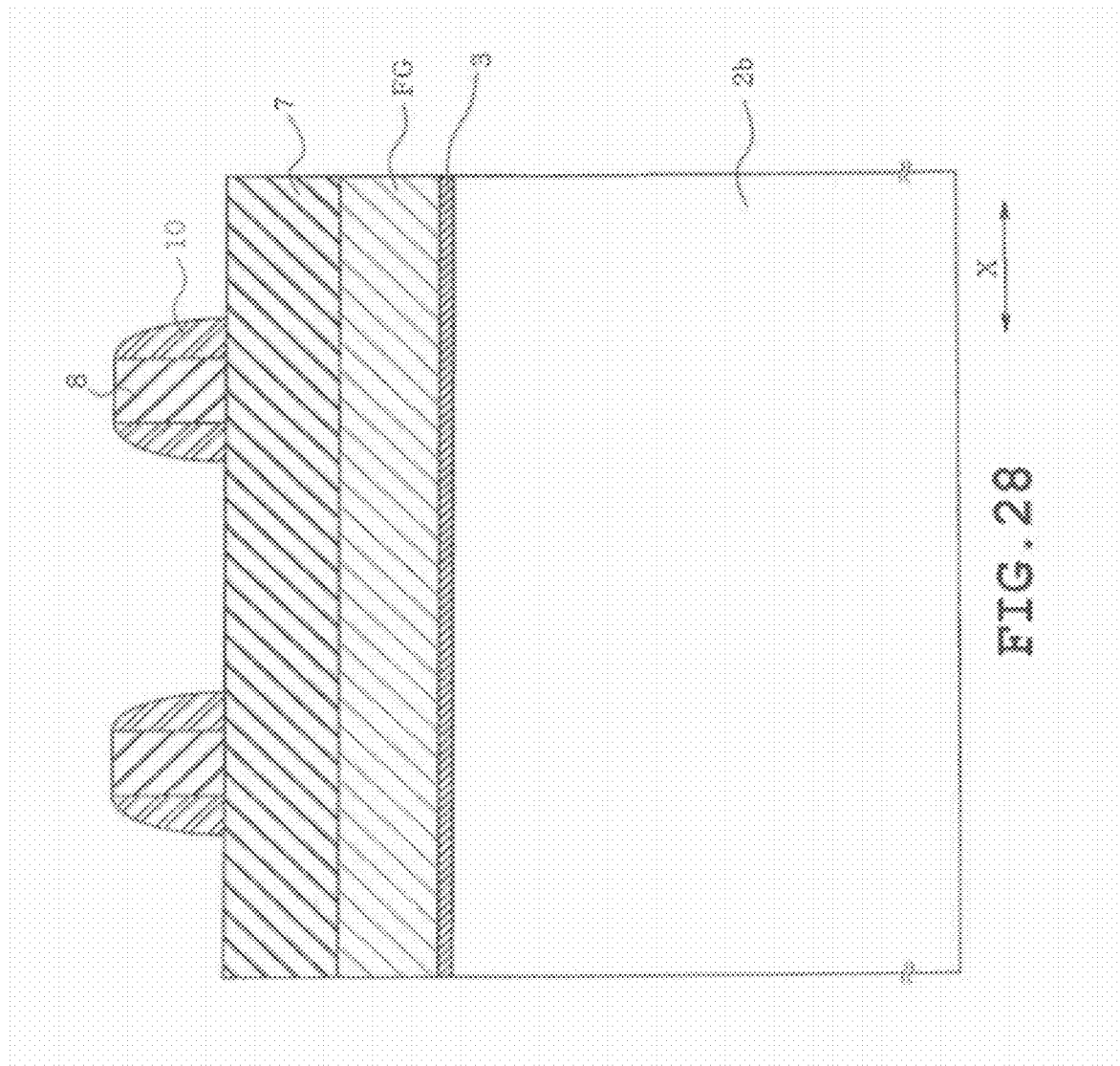

Next, as shown in FIG. 28, sidewall film 10 is formed along the sidewall of mask 8. This is done substantially in the same way as the first embodiment.

Figure 29:
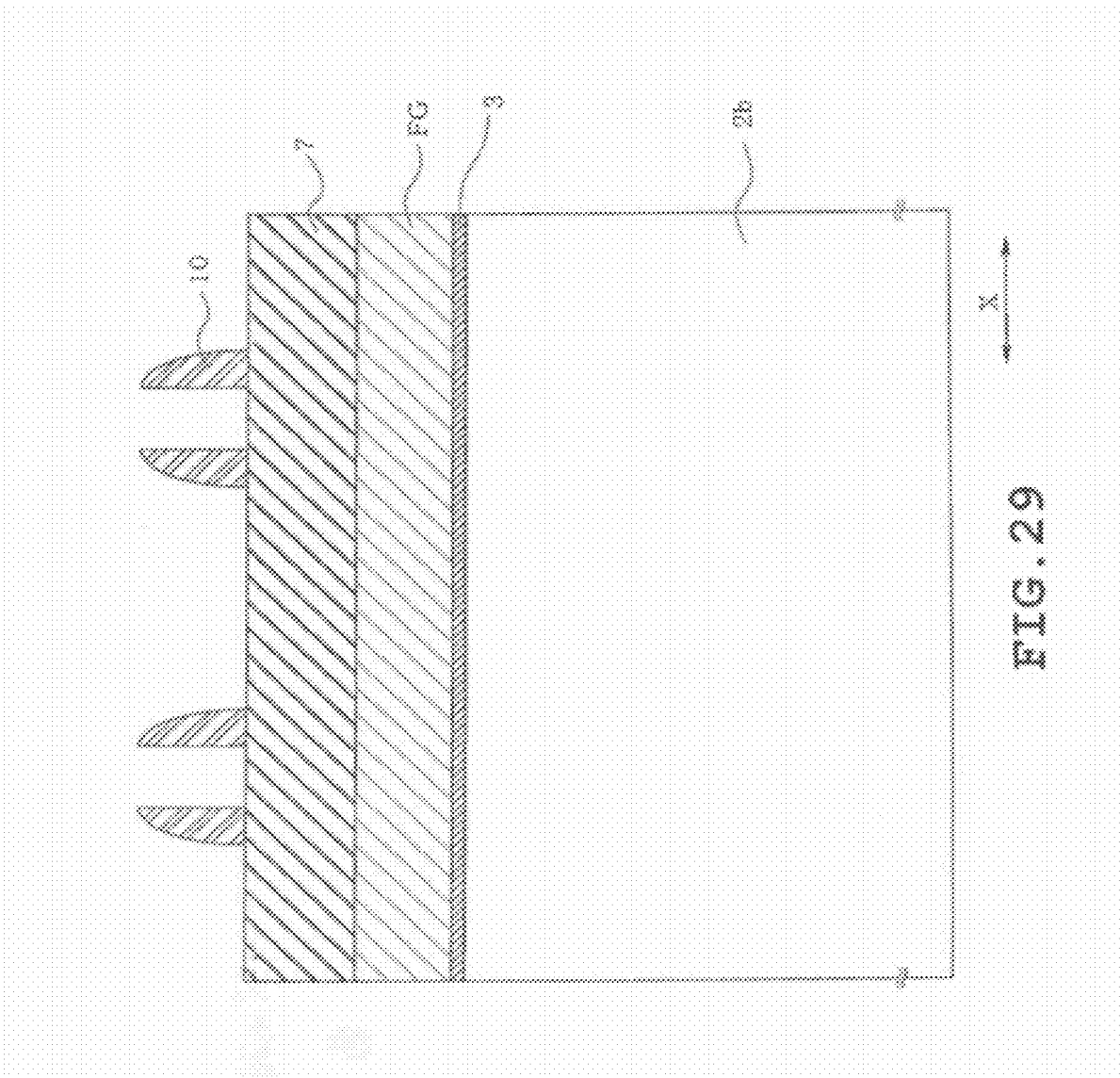

Then, as shown in FIG. 29, mask 8 is removed while leaving sidewall film 10 unremoved. This is also done substantially in the same way as the first embodiment.

Figure 30:
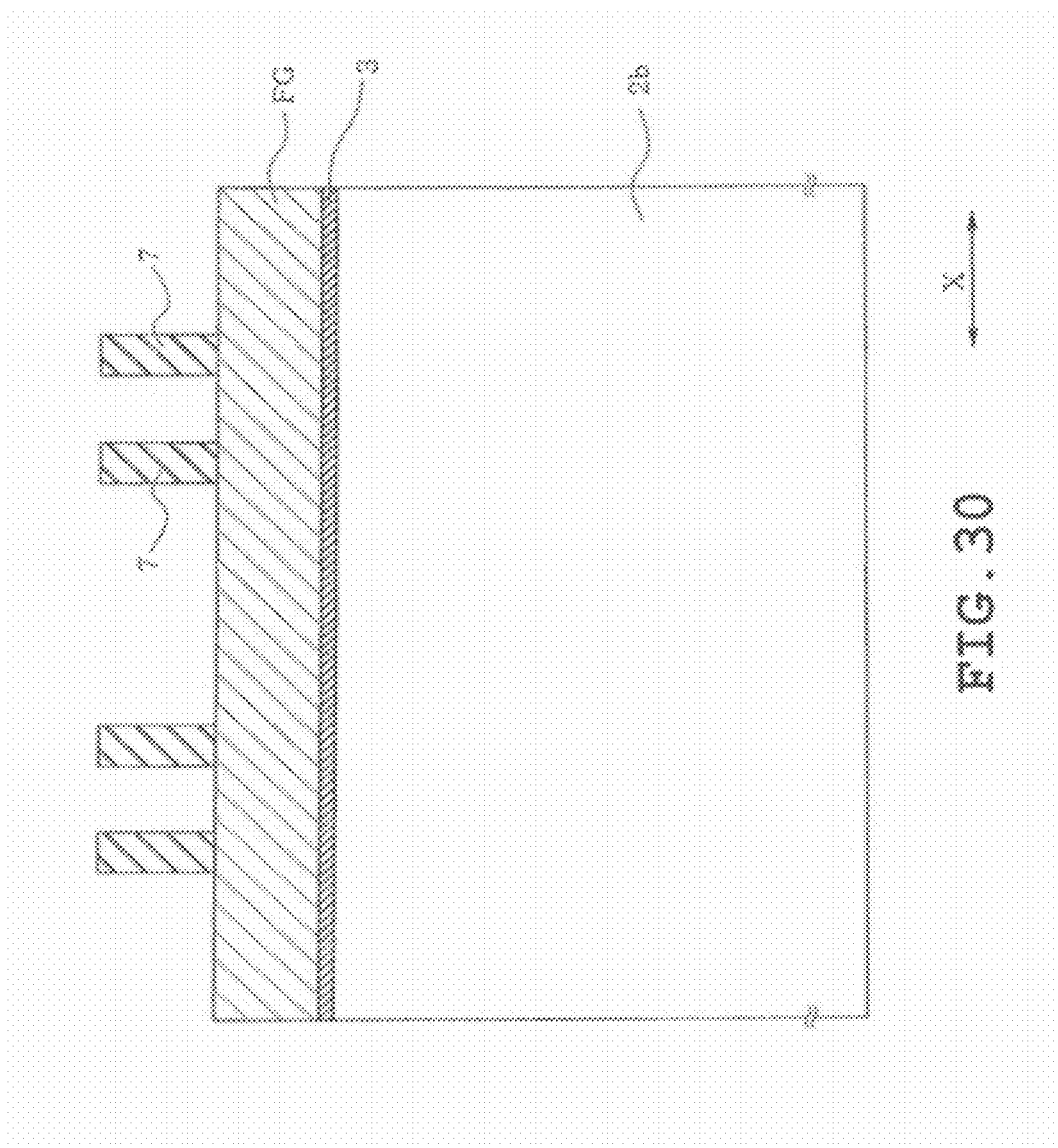

Then, as shown in FIG. 30, mask 7 is etched typically by RIE using sidewall film 10 as a mask. The remaining portion of mask 7, that is, the lines of the resulting line and space (L/S) pattern obtained by transferring sidewall film 10 by RIE serves as a core for the subsequent SWT. The width of the lines of mask 7 corresponds to width W2 which is the width of element isolation insulating film 6b situated between memory cells MC and dummy cells TC.

Figure 31:
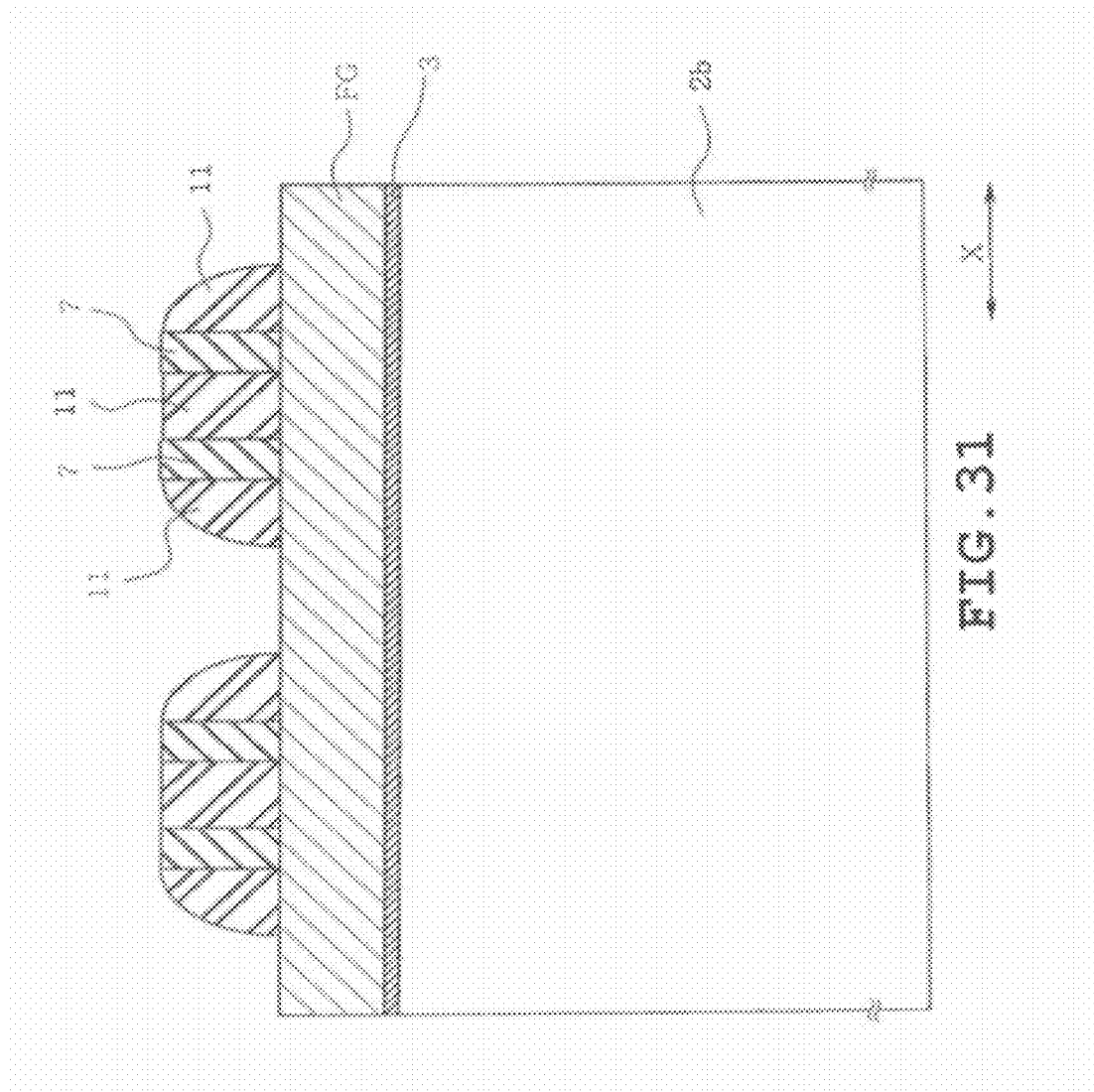

Next, as shown in FIG. 31, mask 11 is formed between the pair of adjacent lines of mask 7 and along the sidewall of the pair of lines of mask 7. Mask 11 is made of a material which differs from the material of floating gate electrode FG and the material of mask 7 such that the materials have etching selectivity to one another. Though not shown, mask 11 may be formed by covering pairs of the lines of mask 7, and thereafter anisotropically etching mask 11 such that mask 11 remains along the sidewall of the lines of mask 7. Of note is that mask 11 remaining between the pair of the lines of mask 7 remain unremoved after this step unlike the first embodiment.

Figure 32:
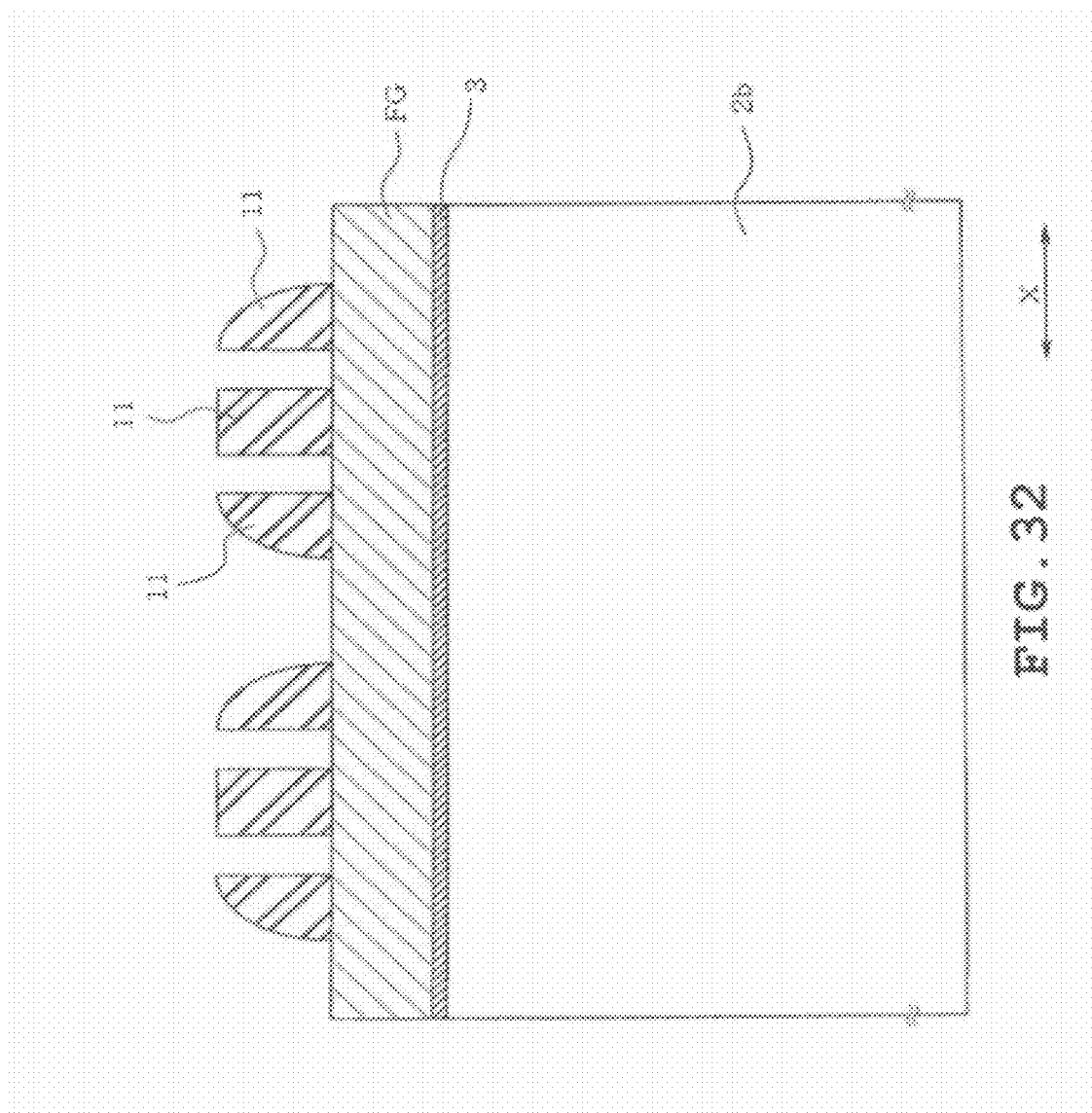

Then, as shown in FIG. 32, the lines of mask 7 between the remaining portions of mask 11 are removed by wet etching.

Figure 33:
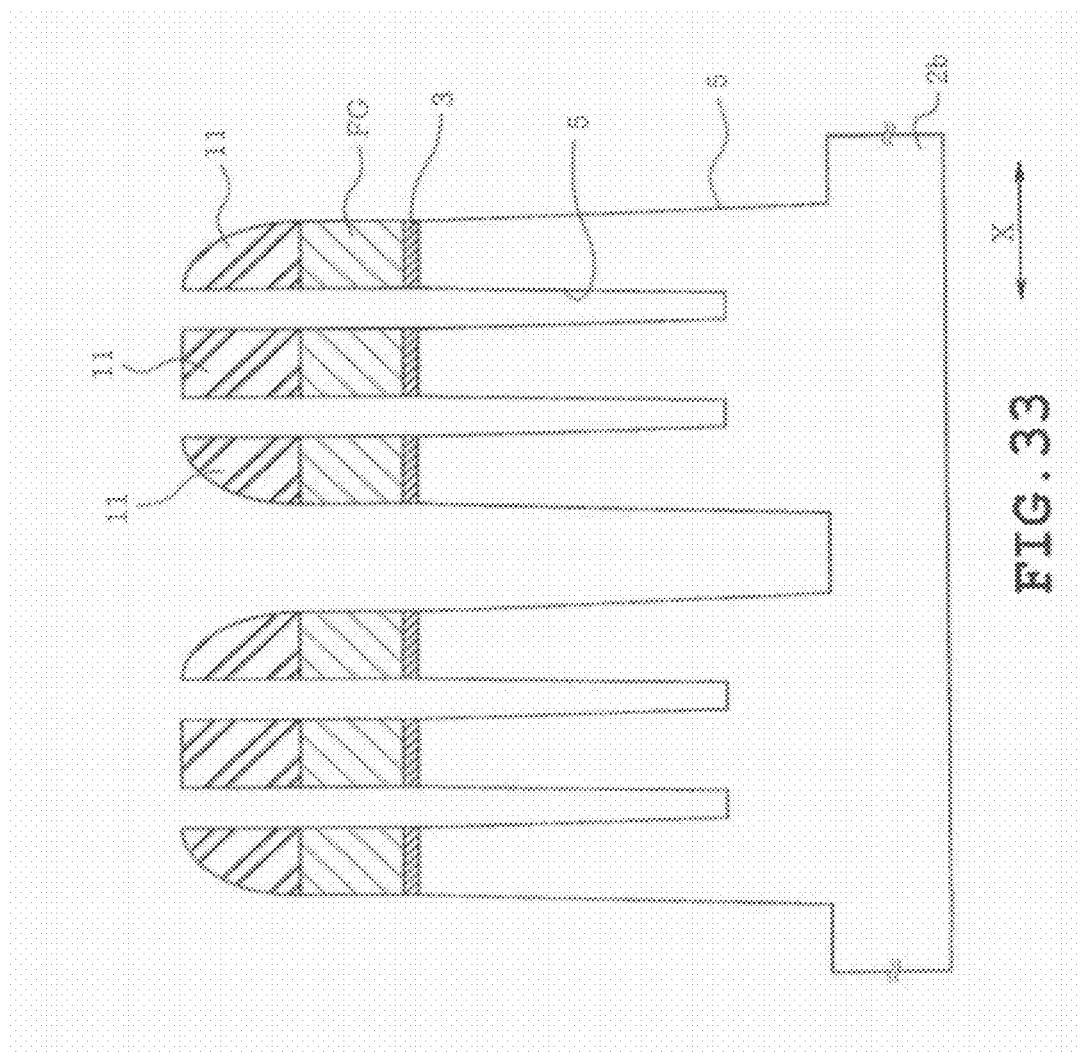
Figure 34:
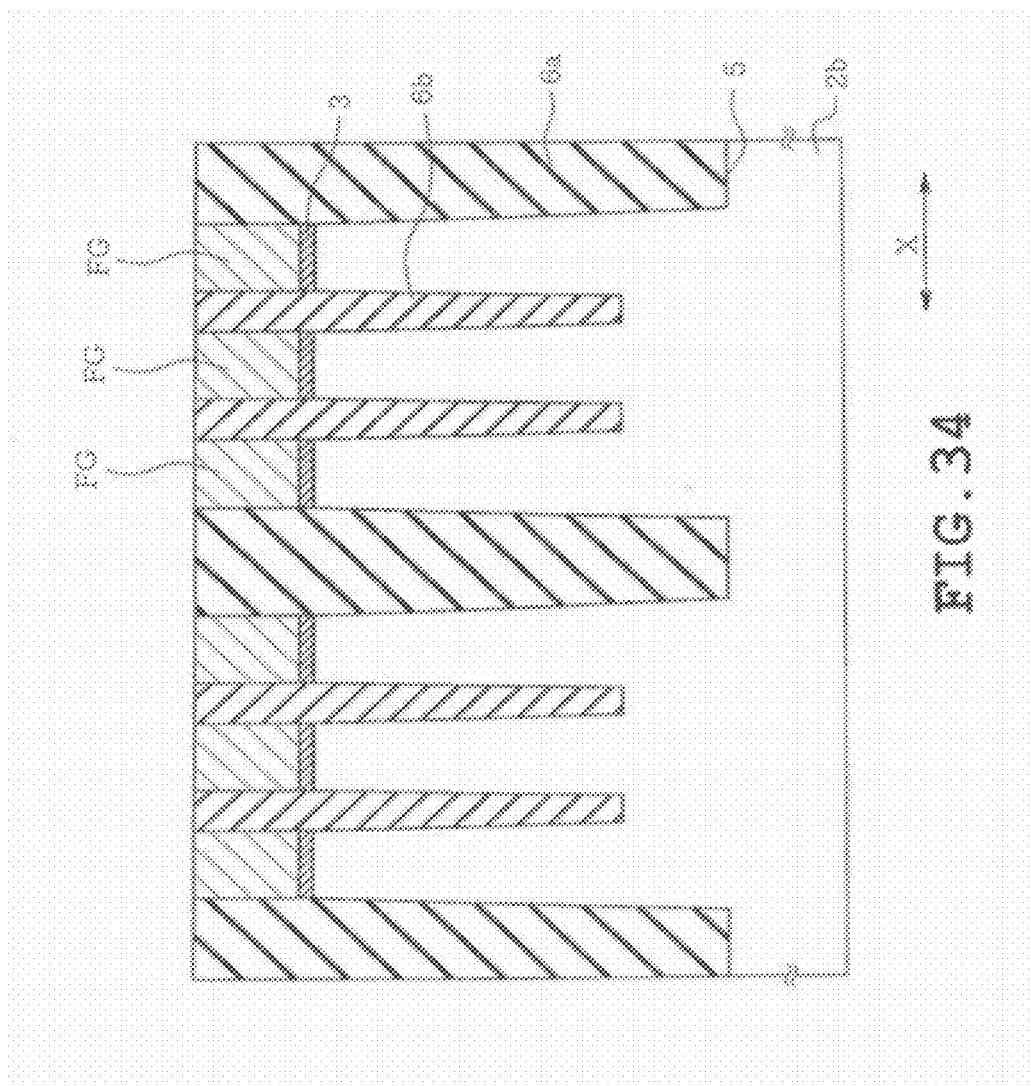

Next, as shown in FIG. 33, using the remaining portions of mask 11 as a mask, floating gate electrode FG film, gate insulating film 3, and p well 2b within semiconductor substrate 2 are etched by RIE to form element isolation trench 5.

As was the case in the first embodiment, the depth of element isolation trench 5 relies on its width such that element isolation trenches 5 located between relatively closely spaced mask 11 remnants are shallow, whereas element isolation trenches 5 located between relatively distantly spaced mask 11 remnants are deep.

Then, the remainders of mask 11 are removed and element isolation insulating films 6a and 6b are filled in element isolation trench 5 in substantially the same manner as described in the first embodiment.

Figure 35:
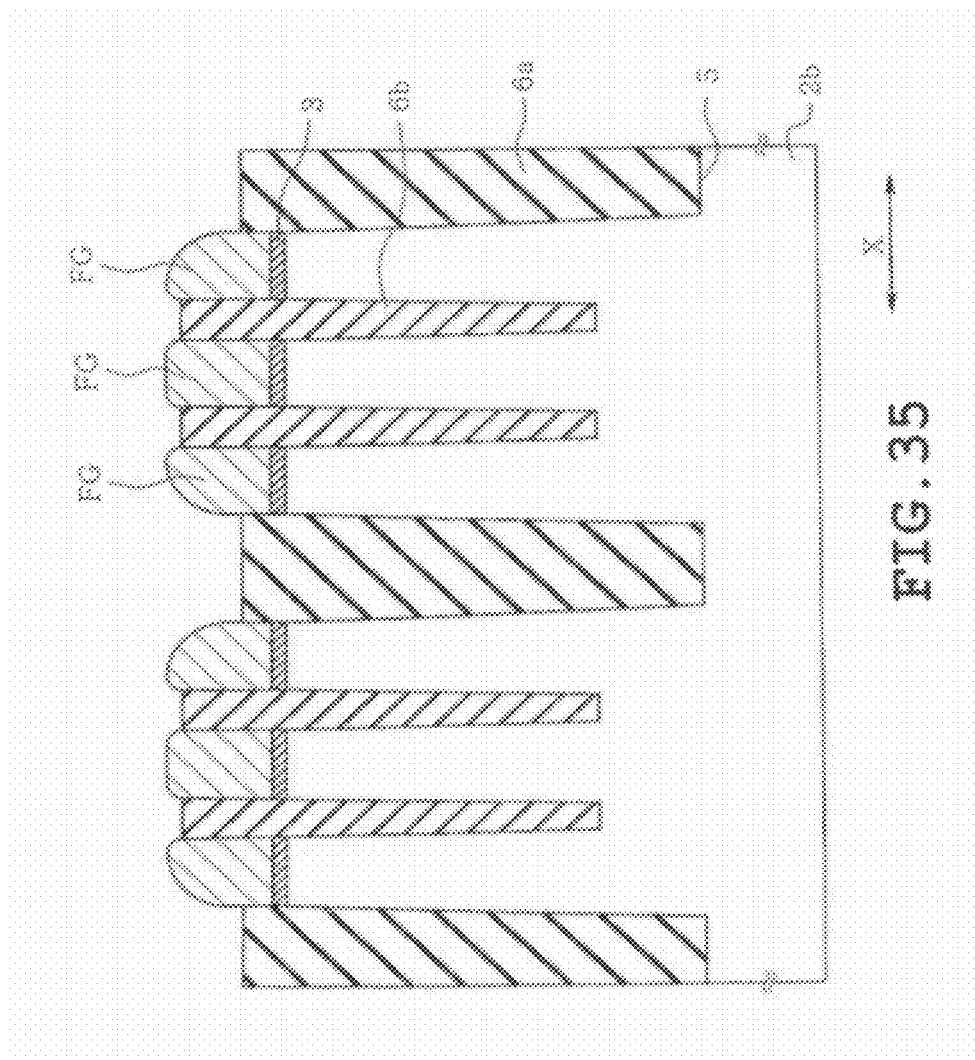

Next, as shown in FIG. 35, element isolation insulating films 6a and 6b are etched until they are lowered below the height of floating gate electrode FG. As was the case in the first embodiment, the height of element isolation insulating films 6a and 6b rely on their widths and thus, element isolation insulating film 6a which is relatively wider results in lower upper surface, whereas element isolation insulating film 6b which is relatively narrower results in higher upper surface.

The upper portion of floating gate electrode FG protruding upward from the upper surface of element isolation insulating films 6a and 6b are etched into round upper corners when proper etching selectivity is specified as can be seen in FIG. 35. Then, intergate insulating film 4 and word lines WL are formed in the listed sequence, whereafter interlayer insulating film, bit line contact CB, source line contact CS, bit line BL and source line CSL are formed. The fabrication process flow, and materials used for the above described elements will not be redescribed since they are substantially the same as those described in the first embodiment. The subsequent process flow will not be described since they are not essential to the features of the third embodiment.

By employing the above described process flow, the structure of the first embodiment can be obtained even in sublithographic design rules, which is further advantageous in providing NAND flash memory device 1 that runs faster with improved reliability.

Figure 36:
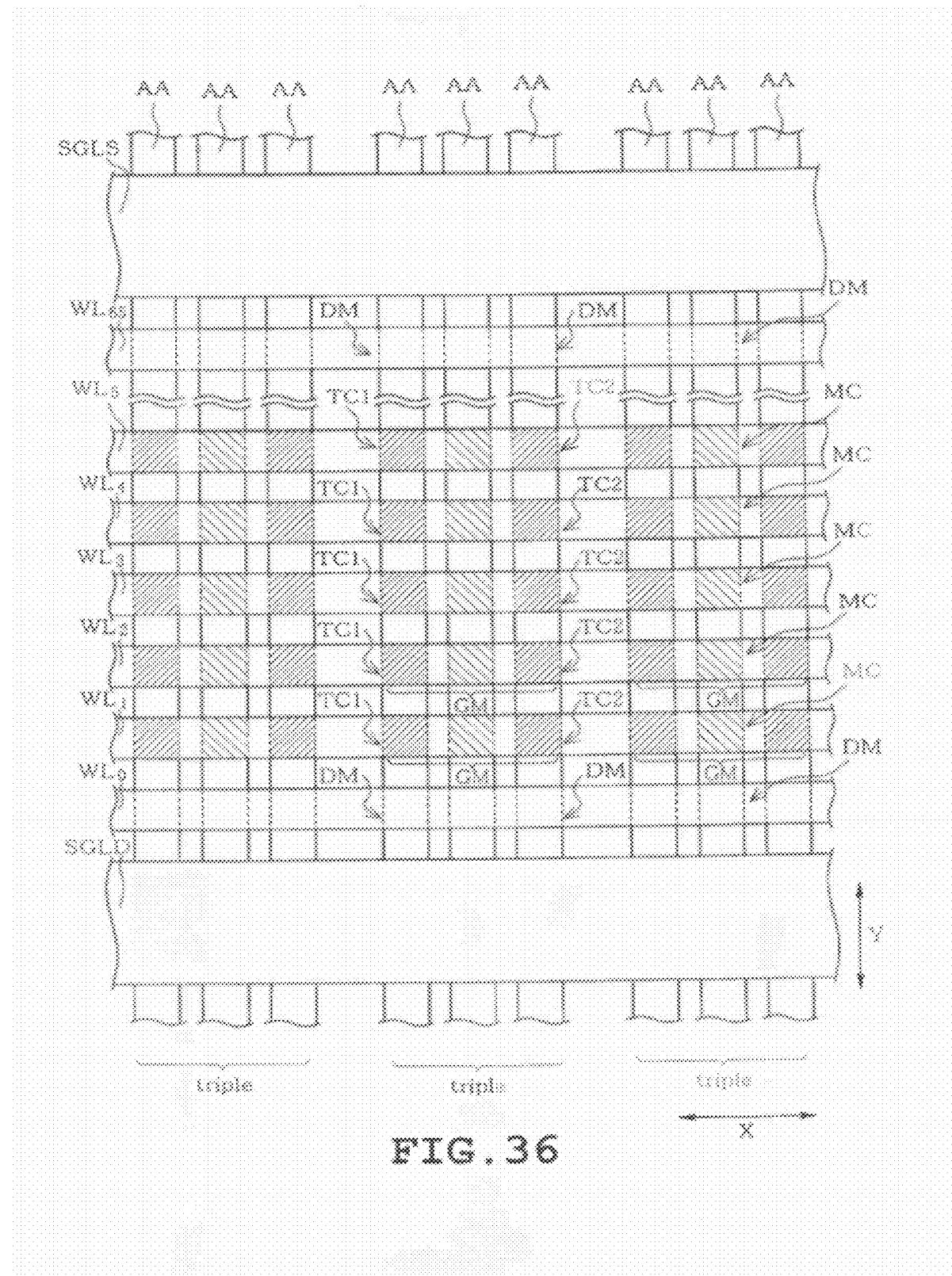
FIG. 36 corresponds to FIG. 3 and illustrates a fourth embodiment.

FIGS. 36 and 37 indicate a fourth embodiment which differs from the third embodiment in that dummy cells TC for threshold voltage adjustment located at both sides of memory cell MC are used independently. The elements that are identical or similar to the first to third embodiments will be identified with identical or similar reference symbols and will not be redescribed.

FIG. 36 illustrates the layout/allocation of memory cell MC and dummy cell TC. In FIG. 36, the dummy cell on one side of memory cell MC is indicated as dummy cell TC1 and the dummy cell on the other side of memory cell MC is indicated as dummy cell TC2. In the fourth embodiment, dummy cells TC1 and TC2 function as voltage application target cells for threshold voltage adjustment. A plurality of dummy cells TC1 is provided in one of the two active areas AA beside the central active area AA in which memory cells MC are formed. A plurality of dummy cells TC2 is provided in the remaining other of the two active areas AA beside the central active area AA in which memory cells MC are formed.

FIGS. 37A to 37E indicate the threshold voltage distribution of memory cell MC and dummy cell TC1 and TC2 configured as described above. As can be seen in FIGS. 37A to 37E, control circuit CC programs threshold voltage Vt of memory cell MC ranging within the erase voltage distribution represented as distribution E such that threshold voltage Vt is temporarily raised into preliminary programming voltage distribution represented as distribution B.

Figure 37A:
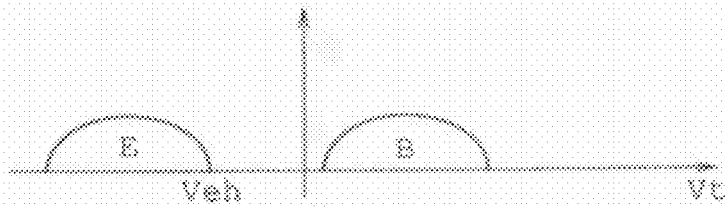
FIGS. 37A to 37E are charts indicating the transition in the distribution of the threshold voltage according to the fourth embodiment.
Figure 37B:
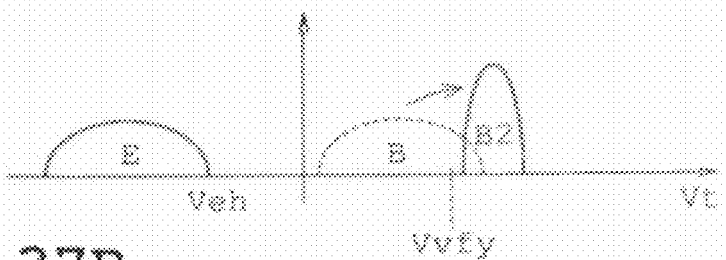
Figure 37C:
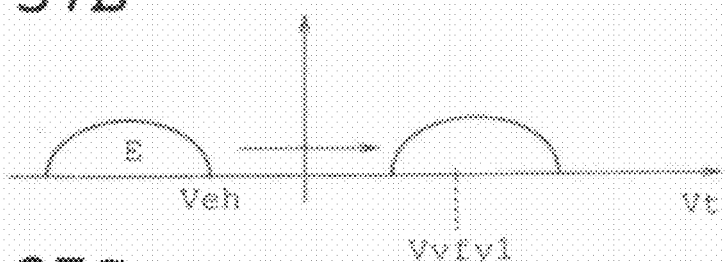

Then, voltage is applied to dummy cell TC1 to adjust threshold voltage Vt of memory cell MC into a voltage distribution represented as distribution B2 which is equal to or greater than verify voltage Vvfy1. FIG. 37B shows the above mentioned transition in threshold voltage distribution of memory cell MC and FIG. 37C shows the transition of the threshold voltage distribution in dummy cell TC1 by the applied voltage. This voltage adjustment is done through the stepped voltage scheme described in the first to third embodiments.

Figure 37D:
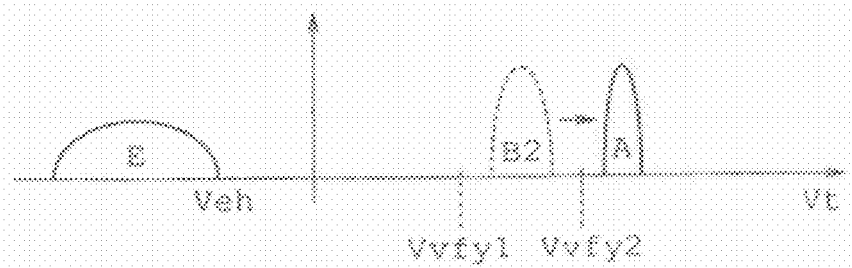
Figure 37E:
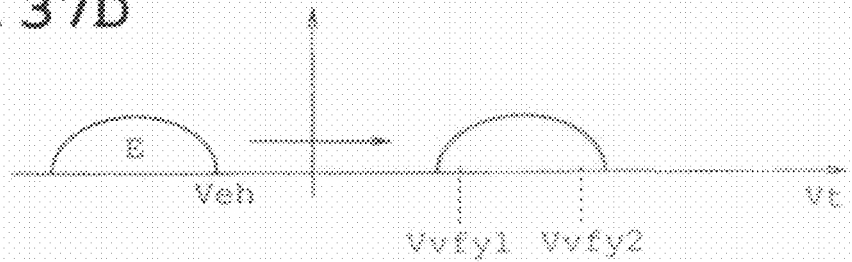

Then, control circuit CC applies voltage to dummy cell TC2 in order to adjust threshold voltage Vt of memory cell MC into the desired voltage distribution represented as distribution A which is equal to or greater than verify voltage Vvfy2 greater than Vvfy1. FIG. 37D shows the above mentioned transition in threshold voltage distribution of memory cell MC and FIG. 37E shows the transition of the threshold voltage distribution in dummy cell TC2 by the applied voltage. Thus, by sequentially applying voltage to dummy cells TC1 and TC2, threshold voltage Vt of memory cell MC located between dummy cell TC1 and dummy cell TC2 can be raised to the desired threshold voltage distribution represented as distribution A.

In the above configuration, voltage applied to neither dummy cell TC1 nor TC2 needs to be raised as high as a voltage level within the desired distribution range and thus, voltage applied to dummy TC1 and TC2 can be reduced as compared to the first to third embodiments. Accordingly, dummy cells TC1 and TC2 can be made less affected by stress.

The above described embodiments may be modified or expanded as follows.

Semiconductor substrate 2 may comprise SOI (Silicon on Insulator) wafer.

Figure 38:
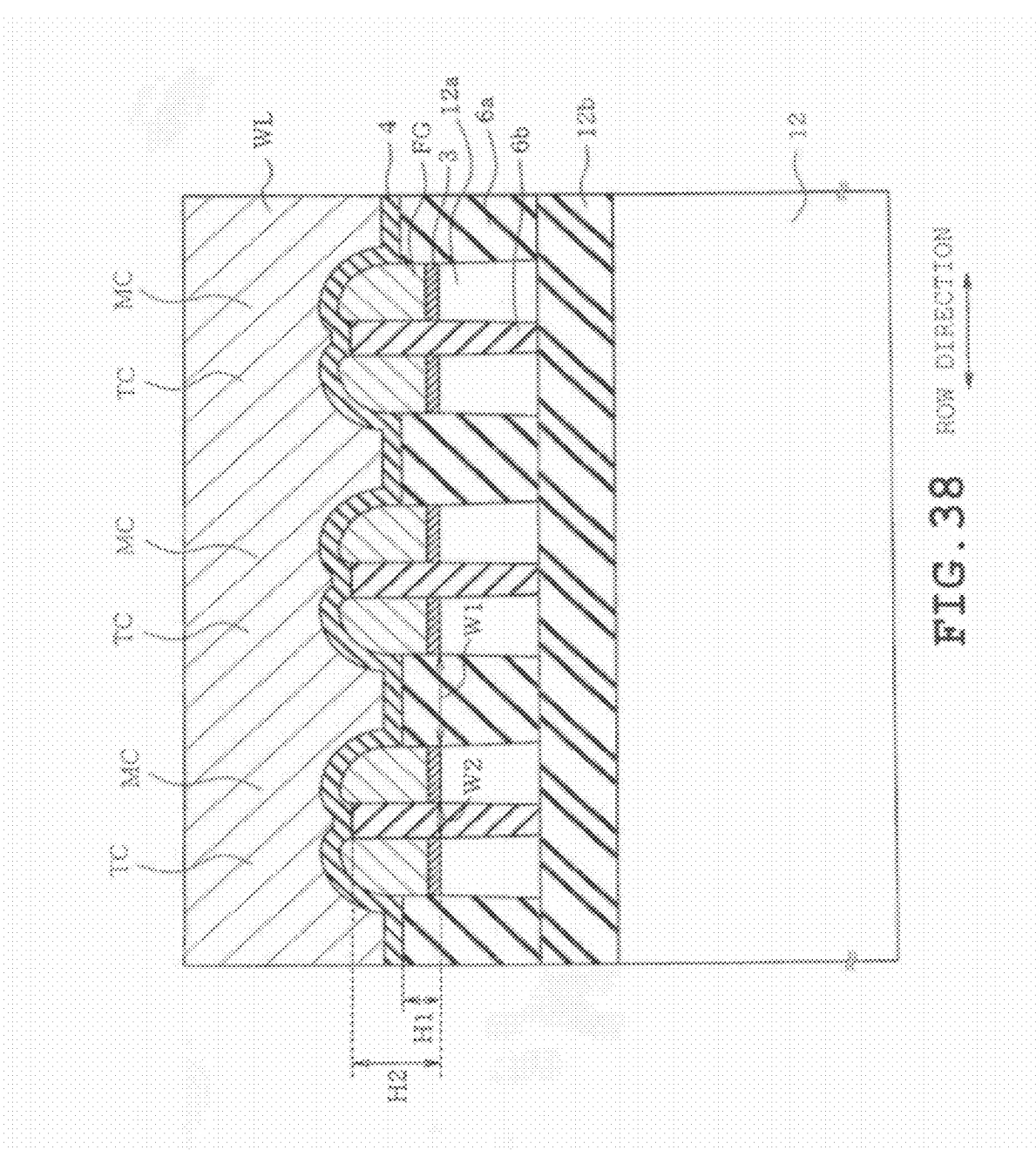
FIG. 38 corresponds to FIG. 5 and illustrates a modified embodiment.

FIG. 38 illustrates a modified embodiment in which semiconductor substrate having an SOI structure is employed. As can be seen in FIG. 38, semiconductor substrate 2 employed in the first to third embodiments are replaced by semiconductor substrate 12 having semiconductor region 12a formed in its surface. Semiconductor region 12a has active areas AA formed therein which further includes memory cell MC and dummy cell TC structures. Insulating film 12b constituting the SOI structure is substantially level across the entire active area AA and thus, the lower end depths of element isolation insulating films 6a and 6b are substantially equal across the wafer. Insulating film 12b and element isolation insulating films 6a and 6b isolate active area AA of each memory cell MC and dummy cell TC. The above described structure also provides advantages similar to those of the first to fourth embodiments.

In the first embodiment, programming threshold voltage Vt of memory cell MC to a low voltage level lower than the target threshold voltage such as verify voltage Vvfy or lower limit voltage Val was carried out in a single preliminary programming process, however, the preliminary programming process may be carried out more than once by employing the stepped programming scheme.

Further, the preliminary programming need not be adjusted to threshold voltage Vt lower than the target threshold voltage such as verify voltage Vvfy or lower limit voltage Val but may be equal to or greater than such target threshold voltages.

The X-directional cross sections of cell group GM as well as cells MC and TC shown in FIGS. 5 and 25 are examples and thus, other layout may be employed as long as the distance between the adjacent cells MC and TC are different and the relation of capacitance satisfies those of FIG. 12.

The first to fourth embodiments were based on examples of the threshold voltage being programmed so as to be adjusted into either of the two voltage distributions that are separated from each other and associated with binary data. However, the threshold voltage may be programmed to be adjusted into three or more voltage distributions separated from each other and associated with ternary or quaternary data. Further, memory cell array Ar may be partially configured by binary cells and partially by other multilevel cells.

The above described configuration is not limited to NAND flash memory application but may be applied to other EEPROM such as AND type nonvolatile semiconductor storage device.

The first to fourth embodiments were based on memory cell array Ar entirely configured by cell groups GM. Alternatively, memory cell array Ar may be partially configured by cell group GM. In such case also, memory cell array Ar may be partially configured by binary cells and partially by other multilevel cells.

The first to fourth embodiments were based on memory cell array Ar configured by a single plane. In a modified embodiment, memory cell array Ar may be configured by multiple planes.

The first to fourth embodiments were provided with a single dummy cell DM adjacent to the drain side select transistor STD and the source side select transistor STS. Alternatively, each of select transistors STD and STS may be provided with 2 or more dummy cells DM.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor storage device, comprising:
    a cell group including a first memory cell and a second memory cell located first directionally adjacent to the first memory cell; and
    a programming circuit;
    wherein the first memory cell is used for storing data and the second memory cell is used for adjustment of a threshold voltage of the first memory cell and not for storing data; and
    wherein the programming circuit is configured to program the first memory cell by applying voltage to the second memory cell to control the threshold voltage of the first memory cell to be higher than a first threshold voltage.

2. The device according to claim 1, wherein the cell group further includes a first active area and a second active area located first directionally adjacent to the first active area with an element isolation region interposed therebetween,
    the first memory cell being formed in the first active area includes a first gate insulating film formed above the first active area, and a first floating gate electrode formed above the first gate insulating film,
    the second memory cell being formed in the second active area includes a second gate insulating film formed above the second active area and a second floating gate electrode formed above the second gate insulating film, and
    wherein the cell group further includes a word line extending along the first and the second floating gate electrodes over an intergate insulating film, the programming circuit being configured to program the first memory cell by applying voltage between the word line and the second active area having the second floating gate electrode of the second memory cell interposed therebetween to control the threshold voltage of the first memory cell located adjacent to the second memory cell within the same cell group to be higher than the first threshold voltage.

3. The device according to claim 1, wherein programming circuit is configured to apply voltage to the second memory cell such that the applied voltage is gradually stepped up.

4. The device according to claim 1, wherein the programming circuit is configured to control the threshold voltage of the first memory cell to be higher than the first threshold voltage by performing a preliminary programming to raise the threshold voltage of the first memory cell to range within a preliminary threshold voltage distribution less than a target threshold voltage distribution, and thereafter applying voltage to the second memory cell.

5. The device according claim 4, wherein the programming circuit is configured to perform the preliminary programming by gradually stepping up the applied voltage.

6. The device according to claim 1, further comprising a control circuit configured to swap tasks of the first and the second memory cells when a predetermined times of program/erase cycle has been exceeded such that the second memory cell is used for storing data and the first memory cell is used for adjustment of the threshold voltage of the second memory cell and not for storing data.

7. The device according to claim 2, wherein the first and the second memory cells are located alternately along a second direction orthogonal to the first direction within the same first or the second active area.

8. The device according to claim 1, wherein the cell group further includes a first active area and a second active area located first directionally adjacent to the first active area, and wherein a plurality of the first memory cells is located adjacent to one another along a second direction orthogonal to the first direction within the same first active area, and wherein a plurality of the second memory cells is located adjacent to one another along the second direction within the same second active area.

9. The device according to claim 1, wherein the second memory cell is located on both first directional sides of the first memory cell, and the programming circuit is configured to adjust the threshold voltage of the first memory cell by performing a preliminary programming on the first memory cell and thereafter simultaneously applying voltage on the second memory cells located on both first directional sides of the first memory cell.

10. The device according to claim 1, wherein the second memory cell is located on both first directional sides of the first memory cell, and the programming circuit is configured to adjust the threshold voltage of the first memory cell by performing a preliminary programming on the first memory cell and thereafter independently applying voltage on the second memory cells located on both first directional sides of the first memory cell.

11. The device according to claim 1, wherein the programming circuit is configured to adjust a threshold voltage into two voltage distributions each representing a data value and being independent of one another.

12. The device according to claim 1, wherein the programming circuit is configured to adjust a threshold voltage into three or more voltage distributions each representing a data value and being independent of one another.

13. The device according to claim 1, wherein the first and the second memory cells within the same cell group are spaced from one another by a first width and the cell group is spaced from another first directionally adjacent cell group by a second width greater than the first width.

14. The device according to claim 1, further comprising a first element isolation region having a first height formed between the first and the second memory cell within the cell group, and a second element isolation region having second height formed between the first or the second memory cell of the cell group and the first or the second memory cell of another cell group first directionally adjacent thereto, wherein the first height is greater than the second height.

15. The device according to claim 1, further comprising a first element isolation region having a first depth formed between the first and the second memory cell within the cell group, and a second element isolation region having second depth formed between the first or the second memory cell of the cell group and the first or the second memory cell of another cell group first directionally adjacent thereto, wherein the first depth is less than the second depth.

16. The device according to claim 1, further comprising a first element isolation region having a first depth formed between the first and the second memory cell within the cell group, and a second element isolation region having second depth formed between the first or the second memory cell of the cell group and the first or the second memory cell of another cell group first directionally adjacent thereto, wherein the first depth is equal to the second depth.

* * * * *